(12) United States Patent
Hosokawa et al.

(10) Patent No.: US 8,030,839 B2
(45) Date of Patent: Oct. 4, 2011

(54) PHOSPHOR ACTIVATED WITH EUROPIUM, LIGHT EMITTING DEVICE USING THE SAME AND METHOD OF MANUFACTURING THE PHOSPHOR

(75) Inventors: Shoji Hosokawa, Tokushima (JP); Masatoshi Kameshima, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/734,872

(22) PCT Filed: Aug. 19, 2008

(86) PCT No.: PCT/JP2008/064761
§ 371 (c)(1),
(2), (4) Date: May 28, 2010

(87) PCT Pub. No.: WO2009/069345
PCT Pub. Date: Jun. 4, 2009

(65) Prior Publication Data
US 2010/0301738 A1 Dec. 2, 2010

(30) Foreign Application Priority Data
Nov. 30, 2007 (JP) .................................. 2007-311599

(51) Int. Cl.
*H05B 33/00* (2006.01)
(52) U.S. Cl. .................................. 313/503; 252/301.4 F
(58) Field of Classification Search .......... 313/504–512, 313/503; 252/301.4 F, 301.4 R
See application file for complete search history.

(56) References Cited

U.S. PATENT DOCUMENTS

| | | |
|---|---|---|
| 2003/0006469 A1 | 1/2003 | Ellens et al. |
| 2003/0146690 A1 | 8/2003 | Ellens et al. |
| 2006/0027785 A1 | 2/2006 | Wang et al. |
| 2006/0028122 A1 | 2/2006 | Wang et al. |
| 2006/0279196 A1 | 12/2006 | Hsu |
| 2007/0200095 A1 | 8/2007 | Murazaki |

FOREIGN PATENT DOCUMENTS

| | | |
|---|---|---|
| JP | 2003-535477 | 11/2003 |
| JP | 2003-535478 | 11/2003 |
| JP | 2004-161982 | 6/2004 |
| JP | 2004-179644 | 6/2004 |
| JP | 2004-296830 | 10/2004 |
| JP | 2007-231250 | 9/2007 |

OTHER PUBLICATIONS

International Search Report received in International Application No. PCT/JP2008/064761 (2 pgs.), Dec. 2008, published.
Xiao Zhang et al., "Luminescence Properties and Energy Transfer of $Eu^{2+}$ Doped $Ca_8Mg(SiO_4)Cl_2$ Phosphors", Journal of the Electrochemical Society, vol. 139, No. 2, Feb. 1992, pp. 622-625.

*Primary Examiner* — Joseph L Williams
(74) *Attorney, Agent, or Firm* — Foley & Lardner LLP

(57) ABSTRACT

Provided are a phosphor which is capable of emitting green light of high luminance and in which unfavorable effects on other members has been reduced so as to be applicable to white light having excellent light emitting characteristics, a light emitting device using the phosphor, and a method for manufacturing the phosphor. The phosphor containing silicon, magnesium, and chlorine, and activated with europium and capable of emitting green light, in which the molar ratio of chlorine to magnesium is in a range of $1.0 \leq Cl/Mg \leq 1.9$. Introduction of chlorine at such a composition ratio improves the light emitting characteristics and the amount of chlorine dissolved.

10 Claims, 25 Drawing Sheets

COMPARATIVE EXAMPLE 1

EXAMPLE 1

EXAMPLE 2

(a)

(b)

(a)

(b)

PHOSPHOR ACTIVATED WITH EUROPIUM, LIGHT EMITTING DEVICE USING THE SAME AND METHOD OF MANUFACTURING THE PHOSPHOR

FIELD OF THE INVENTION

The present invention relates to a phosphor and a light emitting device using the phosphor and a method of manufacturing the phosphor, and more particularly relates to a green light emitting phosphor with improved brightness and a light emitting device using the phosphor and a method of manufacturing the phosphor.

DESCRIPTION OF THE RELATED ART

There have been developed a light emitting device capable of emitting light of various wavelengths according to the principle of color mixing of light which is obtained by combining a source light emitted from a light emitting element and a wavelength converting member which is excited by the source light and is capable of emitting light of different hue than that of the source light. For example, when a primary light ranging from ultraviolet region to visible light is emitted from a light emitting element to excite R•G•B (Red, Green, Blue) phosphors which are wavelength conversion members, the three primary colors of light: red, blue, and green are additively mixed and white light is generated. Among them, a green light emitting phosphor has a large contribution to white (light), so that high requirement on the light emitting characteristics is imposed thereon, and various phosphors have been studied.

For example, Patent document 1 and Patent document 2 describe a light emitting device which is an LED-based white light emitting lighting unit and in which an LED emits a primary UV radiation or Blue light. A phosphor capable of emitting green light is contained in the lighting unit. The primary radiation is partially converted by the phosphor and a mixed-color light can be obtained from the lighting unit. In this lighting unit, calcium-magnesium-chlorosilicate ($Ca_8Mg(SiO_4)_4Cl_2$) activated with Eu is used as the green phosphor.

On the other hand, in recent years, there has been a growing need for higher brightness and higher precision in a cathode-ray tube such as a color Braun tube (CRT), a projection cathode ray tube (PRT), a field emission display (FED), or a vacuum fluorescent display (VFD), and further characteristic improvement has been required in the phosphors used in these cathode-ray tubes. The ratio of each component of a desired radiation light varies according to the final form of the devices, but in any cases, emission containing a wavelength range that does not correspond to the effective wavelength range is partially cut off by a filter capable of absorbing such light as an inadequate component light for the final utilization system. As a result, a problem would arise in that the amount of luminous flux would be relatively lowered.

For example, a liquid crystal display device is equipped with a color filter for each color to separate white light into its RGB components. A color filter transmits light of a predetermined range of wavelength to display a desired color. Therefore, in order to generate a white light by using a light emitting element and a phosphor according to the same principle in the light emitting device as described above, and further, to separate the white light into each of the three primary colors by using the color filters, it is desirable from a light effectiveness standpoint that the peak of the transmissivity of a color filter matches the peak of the emission line of the corresponding separated color, and that there are no overlapping in light transmission characteristics between the color filters corresponding to each color.

Patent Document 1: JP2003-535477(T)
Patent Document 2: JP2003-535478(T)

DISCLOSURE OF INVENTION

Problem to be Solved by the Invention

However, as a phosphor used in a light emitting device including a display and lighting, the composition of the above-described green light emitting phosphor will result in insufficient brightness and large light loss, and therefore further improvement in the light emitting characteristics has been required. For example, an attempt to reproduce G-component by using the chlorosilicate phosphor which is described in Patent Document 1 or Patent Document 2, the peak wavelength of the emission will be at a shorter wavelength side than the ideal wavelength. Accordingly, in order to block unnecessary emission lines, a need arose to increase the pigment concentration in the color filter to improve the filtering characteristics of the color filter. However, this results in insufficient brightness due not only to light loss but also to decrease in the transmissivity of the color filter.

Further, a relatively large amount of chlorine is contained in the basic composition of the above-mentioned phosphor, therefore, unfavorable effects will arise when this phosphor is disposed on the light emitting device in which a semiconductor element is its light source. This problem will be described below referring to FIG. 36. FIG. 36 shows a cross-sectional view of a typical light emitting device 100. The light emitting device 100 has a cup 110 defining a recess which opens upward, and a light emitting element 101 mounted in the cup 110. The cup 110 is filled with an encapsulating resin 103 containing a phosphor 102. In addition, the light emitting element 101 is electrically connected by conductive wires 107 to positive and negative lead electrodes 105 disposed on a surface of a supporting body 104, and emits light by receiving a power supply from outside through the lead electrodes 105. Light emitted from the light emitting element 101 transmits through an encapsulating resin 103, and a part of the emitted light is wavelength-converted by the phosphor 102. Thus, a mixed-color light is emitted from the upper surface side in FIG. 36 to outside.

In such a light emitting device 100, a means is generally provided for reflecting light propagating from the light emitting element 101 in an undesired direction to the light extracting side by using a reflecting member. For example, in FIG. 36, a reflecting member 106 of a metal material is coated on the lead electrodes 105, and light is reflected by the reflecting member 106 to improve the light gathering rate.

On the other hand, as a resin material of the encapsulating member, a resin material excellent in heat resistance and weather resistance is commonly used, but such a resin material generally has a tendency to have a low gas barrier property. Accordingly, a constituent element of the phosphor which is included in a resin may dissolve due to the gas or moisture that permeated through the resin, which results in deterioration of the metal reflecting member. This may result in a reduction in the reflectivity which could lead to a reduction in output from the light emitting device.

Particularly, in the chlorosilicate phosphor described in Patent Document 1 and Patent Document 2, the chlorine constituent of the phosphor dissolves into the light emitting device with a nonnegligible amount due to a change over time. As a result, in a case where the reflecting member is made of metal material, the dissolved chlorine component would halogenate the metal material to discolor the reflecting member, resulting in a reduction of reflectivity. With this, the light extracting efficiency and light emitting characteristics of the light emitting device may be deteriorated and the life characteristics of the semiconductor element may also be decreased.

The present invention is devised to solve the above-described problems. A main object of the present invention is to provide a phosphor having excellent light emitting properties and capable of emitting green light of high brightness that can be used for white light, and in which unsuitable effects on other members has been reduced, and to provide a light emitting device using the phosphor, and a method for manufacturing the phosphor.

Means to Solve the Problem

The present inventors have intensively studied and accomplished the present invention with a finding that the problems described above can be solved with a phosphor having a specific element composition ratio.

That is, a phosphor according to a first aspect of the present invention is a phosphor which is capable of emitting green light, and which includes silicon, magnesium, and chlorine and is activated with europium, and the molar ratio of chlorine contained in the phosphor to magnesium is in a range of $1.0 \leq Cl/Mg \leq 1.9$.

A phosphor according to a second aspect of the present invention is a phosphor which is activated with europium and is capable of absorbing near-ultraviolet light to blue light and emitting green light, and the substantial composition of the phosphor is represented by the formula shown below in which x, y, z, a, and b are in the ranges as shown below.

$$M_xEu_yMgSi_zO_aX_b$$

(In the above formula, M is at least one selected from the group consisting of Ca, Sr, Ba, Zn, and Mn; X is at least one selected from the group consisting of F, Cl, Br, and I; $6.5 \leq x \leq 8.0$; $0.01 \leq y \leq 2.0$; $3.7 \leq z \leq 4.3$; $a=x+y+1+2z-b/2$; and $1.0 \leq b \leq 1.9$.)

A phosphor according to a third aspect of the present invention is a phosphor which is activated with europium and is capable of absorbing near-ultraviolet light to blue light to emit green light, and the substantial composition of the phosphor is represented by the formula shown below in which x, y, z, a, and b are in the ranges as shown below.

$$M_xEu_yMgSi_zO_aX_b$$

(In the above formula, M is at least one selected from the group consisting of Ca, Sr, Ba, Zn, and Mn; X is at least one selected from the group consisting of F, Cl, Br, and I; $6.0 \leq x \leq 8.0$; $0.01 \leq y \leq 2.0$; $3.7 \leq z \leq 4.3$; $a=x+y+1+2z-b/2$; and $0.80 \leq b \leq 1.9$.)

A phosphor according to a fourth aspect of the present invention is a phosphor which is activated with europium and is capable of absorbing near-ultraviolet light to blue light and emitting green light, the substantial composition of the phosphor is represented by the formula shown below in which x, y, z, w, a, and b are in the ranges as shown below.

$$M_xEu_yMgSi_zAl_wO_aX_b$$

(In the above formula, M is at least one selected from the group consisting of Ca, Sr, Ba, Zn, and Mn; X is at least one selected from the group consisting of F, Cl, Br, and I; $6.5 \leq x \leq 8.0$; $0.01 \leq y \leq 2.0$; $3.7 \leq z \leq 4.3$; $0<w \leq 0.5$; $a=x+y+1+2z+(3/2)w-b/2$; and $1.0 \leq b \leq 1.9$.)

A phosphor according to a fifth aspect of the present invention is a phosphor which is activated with europium and is capable of absorbing near-ultraviolet light to blue light and emitting green light, the substantial composition of the phosphor is represented by the formula shown below in which x, y, z, w, a, b, and c are in the ranges as shown below.

$$M_xEu_yMgSi_zAl_wO_aX_bN_c$$

(In the above formula, M is at least one selected from the group consisting of Ca, Sr, Ba, Zn, and Mn; X is at least one selected from the group consisting of F, Cl, Br, and I; $6.5 \leq x \leq 8.0$; $0.01 \leq y \leq 2.0$; $3.7 \leq z \leq 4.3$; $0<w \leq 0.5$; $a=x+y+1+2z+(3/2)w-b/2-(3/2)c$; $1.0 \leq b \leq 1.9$; and $0 \leq c \leq 3.0$.)

A phosphor according to a sixth aspect of the present invention is a phosphor which is activated with europium and is capable of absorbing near-ultraviolet light to blue light and emitting green light, and the substantial composition of the phosphor is represented by the formula shown below in which x, y, z, a, and b are in the ranges as shown below.

$$Ca_xEu_y(Mg,Mn)Si_zO_aX_b$$

(In the above formula, X is at least one selected from the group consisting of F, Cl, Br, and I; $6.0 \leq x \leq 10.0$; $0.01 \leq y \leq 2.0$; $3.7 \leq z \leq 5.5$; $a=x+y+1+2z-b/2$; and $0.80 \leq b \leq 1.9$.)

A phosphor according to a seventh aspect of the present invention contains chlorine element of 8.0 wt % or less.

A phosphor according to a eighth aspect of the present invention is such that an amount of at least one element selected from the group consisting of Cl, F, Br, I which is dissolved out from the phosphor is 1500 ppm or less.

A phosphor according to a ninth aspect of the present invention is a phosphor which absorbs near-ultraviolet light to blue light to emit green light and which has an emission peak wavelength in a wavelength-range from 495 nm to 548 nm.

A phosphor according to a tenth aspect of the present invention is a phosphor having an average particle size of 2 μm to 100 μm.

A light emitting device according to eleventh aspect of the present invention is a light emitting device having an excitation light source which emits light ranging from near-ultraviolet to blue region and a phosphor which absorbs a part of light from the excitation light source and emits green light, where the phosphor according to one of the first to tenth aspects of the present invention is employed.

A light emitting device according to twelfth aspect of the present invention further includes a phosphor of $(Ca_{1-x}Sr_x)AlB_ySiN_{3+y}$:Eu or $(Ca_{1-z}Sr_z)_2Si_5N_8$:Eu in a light emitting device according to the eleventh aspect of the present invention. (In the above formula, $0 \leq x \leq 1.0$; $0 \leq y \leq 0.5$; and $0 \leq z \leq 1.0$.)

In a light emitting device according to a thirteenth aspect of the present invention, further, the encapsulating resin is a silicone system resin having a siloxane bond in its molecule.

A method of manufacturing a phosphor according to a fourteenth aspect of the present invention is a method of manufacturing a phosphor represented by a general formula shown below and capable of emitting green light, the method includes a step of weighing each raw material so that M, Eu, Mg, Si, and X which are the compositional elements of the phosphor satisfy the relation of M:Eu:Mg:Si:X=(6.5 to 7.5):(0.5 to 1.5):1:4:(1.5 to 2.5) and mixing them, and a step of firing the mixed raw materials and further reducing it.

$$M_xEu_yMgSi_zO_aX_b$$

(In the above formula, M is at least one selected from the group consisting of Ca, Sr, Ba, Zn, and Mn; X is at least one selected from the group consisting of F, Cl, Br, and I; $6.5 \leq x \leq 8.0$; $0.01 \leq y \leq 2.0$; $3.7 \leq z \leq 4.3$; $a=x+y+1+2z-b/2$; and $1.0 \leq b \leq 1.9$.)

Effect of the Invention

A phosphor containing silicon, magnesium, and a halogen, which is a green light emitting phosphor having a halogen element in a range from 1.0 to 1.9 times with respect of magnesium element in the element composition ratio of the phosphor, has a light emitting characteristics with high brightness and the amount of dissolved halogen can be significantly reduced. Particularly, the G component of a white color can be reproduced effectively, so that applicability to a light emitting device which emits white light with excellent light emitting characteristics can be increased. In addition, influence of the dissolved halogen to other members can be drastically reduced, so that a light emitting device of excellent life characteristics can be obtained.

DESCRIPTION OF THE PREFERRED EMBODIMENTS

The preferred embodiments of the present invention will be described below with reference to the accompanying drawings. The preferred embodiments described below are to exemplify the phosphor and the light emitting device using the phosphor and the method of manufacturing the phosphor so as to materialize the technical idea of the present invention. The present invention does not limit the phosphor and the light emitting device using the phosphor and the method of manufacturing the phosphor to those described below. In addition, the present specification will by no means limit the members described in claims to the members described in the embodiments. Especially, size, material, shape, and the relative configuration etc. of the components described in the preferred embodiments are for illustration, and do not intend to limit the invention therein, unless specifically described. In the drawings, the size and the positional relationship of the components may be exaggerated for clarify. Further, in the description below, identical members or members of the same quality are assigned the same names and reference numerals and detailed description thereof will be appropriately omitted. In each constituting component of the present invention, multiple components may be constructed using the same member so that one member can serve as multiple components, or vice versa, a function of a member may be shared by multiple members. Constitutions described in some of examples and embodiments can be employed in other examples and embodiments.

The relation between the color name and the chromaticity coordinates, the relation between the wavelength of light and the color name of single light, and the like are in accordance with JIS Z8110. Specifically, 380 to 455 nm is a blue purple color, 455 to 485 nm is a blue color, 485 to 495 nm is a blue green color, 495 to 548 nm is a green color, 548 to 573 nm is a yellow green color, 573 to 584 nm is a yellow color, 584 to 610 nm is a yellow red color, and 610 to 780 nm is a red color.

Embodiment 1

The phosphor according to Embodiment 1 is a phosphor containing at least magnesium, silicone, and a halogen, and has europium as its light emission center. In addition, the molar ratio of chlorine element to magnesium element contained in the phosphor is in a range of $1.0 \leq Cl/Mg \leq 1.9$. This phosphor absorbs near-ultraviolet radiation to blue light and emits green light, specifically, has an emission peak in a range of wavelengths of 495 nm to 548 nm. The peak emission wavelength varies depending on the amounts of the elements contained in the phosphor and the composition of the phosphor. Therefore, the emission peak can be adapted to the purpose by controlling the mass ratio of the composition.

A phosphor according to Embodiment 1 is represented by the general formula $M_x Eu_y MgSi_z O_a X_b : Eu^{2+}$ ($6.5 \leq x \leq 8.0$; $0.01 \leq y \leq 2.0$; $3.7 \leq z \leq 4.3$; $a = x+y+1+2z-b/2$; and $1.0 \leq b \leq 1.9$); $M_x Eu_y MgSi_z Al_w O_a X_b$ ($6.5 \leq x \leq 8.0$; $0.01 \leq y \leq 2.0$; $3.7 \leq z \leq 4.3$; $0 < w \leq 0.5$; $a = x+y+1+2z+(3/2)w-b/2$; and $1.0 \leq b \leq 1.9$); or $M_x Eu_y MgSi_z Al_w O_a X_b N_c$ ($6.5 \leq x \leq 8.0$; $0.01 \leq y \leq 2.0$; $3.7 \leq z \leq 4.3$; $0 < w \leq 0.5$; $a = x+y+1+2z+(3/2)w-b/2-(3/2)c$; $1.0 \leq b \leq 1.9$; and $0 \leq c \leq 3.0$). M is at least one element selected from Ca, Sr, Ba, Zn, and Mn, and is preferably Ca, while a portion of Ca may be substituted with Mn, Sr, or Ba. X is at least one selected from the group consisting of F, Cl, Br, and I, and is preferably Cl. A portion of Cl may be substituted with F, Br, or I. Eu is europium, Mg is magnesium, Si is silicon, Al is aluminum, O is oxygen, and N is nitrogen, and a portion of Si may be substituted with Ge or Sn. Further, in the phosphor according to Embodiment 1, Eu which is a rare earth is a light emission center. But, it is not limited only to Eu, a part of Eu can be substituted with other rare earth metals or alkaline earth metals to co-activate the phosphor with Eu. In addition, a part of oxygen can be substituted with nitrogen.

Also, various addition elements as a flux, or boron if needed, may be contained in the phosphor. With this, solid-phase reaction can be facilitated, so that particles of uniform size can be formed. The composition ratio of the phosphor is determined based on elemental analysis of the final product and is different than the composition based on the charged amounts.

The phosphors according to the embodiments of the present invention absorb light in a region from near-ultraviolet to short wavelength side of visible light, and have their emission peak wavelength at a longer wavelength side than the emission peak wavelength of the excitation light. In the present specification, the term "from ultraviolet region to a short-wavelength region of visible light" is not specifically limited, but refers to a region of 250 to 485 nm. Particularly, a region of 290 nm to 470 nm is preferable. A region of 340 nm to 420 nm with low luminosity characteristics is more preferable.

Also, the phosphors preferably have a crystal at least partially. For example, a glass body (amorphous) has a loose structure so that the composition ratio in the phosphor may be non-constant, which may lead to uneven chromaticity. Therefore, a necessity arises to control the reaction conditions in the manufacturing process properly uniformly to avoid the above. On the other hand, the phosphor according to Embodiment 1 can be made not as glass body but as power or particles having crystallinity, that facilitates manufacturing and processing. Also, this phosphor can be dissolved uniformly in an organic medium, so that preparation of luminescent plastics and polymer thin film materials can be easily carried out. Specifically, at least 50% by weight or more, more preferably 80% by weight or more of the phosphors according to Embodiment 1 include a crystal. This shows the percentage of the crystalline phase which has luminescent properties. It is preferable if it has 50% by weight or more of the crystal phase, because light emission sufficient for practical use can be obtained. Therefore, the more the crystalline phase, the better. With this, luminance of light emission can be increased and processability can also be improved.

(Particle Size)

Considering that it is to be used in a light emitting device, the particle size of the phosphor is preferably in a range of 2 μm to 100 μm, more preferably 5 μm to 50 μm. The phosphor having an average particle size of the range described above is preferably contained at a high ratio. Further, it is preferable to have a narrow range of particle size distribution. Using a phosphor having a large particle size with a small deviation in the particle size and particle size distribution and having excellent optical properties enables further reduction of irregular color and a light emitting device with good color tone can be obtained. Therefore, if the phosphor has a particle size of the above-described range, absorptance and conversion efficiency of light are high. On the other hand, the phosphor having a particle size of smaller than 2 μm tends to form aggregations.

(Method of Manufacturing)

The method of manufacturing the phosphor according to Embodiment 1 will be described below. For the phosphor, a single body, an oxide, a carbonate or a nitride of an element which is included in the composition, is used as a raw material. Each raw material is weighed to obtain a predetermined composition ratio. But, for the phosphor according to Embodiment 1, the starting materials are weighed at a charging ratio that is different from the composition ratio of the final product, in view of evaporation or dissolving of a part of the elements during the manufacturing steps. Therefore, in order to distinguish the two ratios, the term "composition ratio of the phosphor" in the present specification indicates the molar ratio of each element in a final phosphor compound which is calculated from the elemental analysis results of actual phosphor. On the other hand, the term "charging composition rate" indicates the molar ratio of each element in the raw materials which contain the constituent elements of the phosphor.

Specifically, each raw material is weighed so that the charging composition ratio of the amounts of M, Eu, Mg, Si, and X in the raw material mixture satisfy the relation of M:Eu:Mg:Si:X=(6.5 to 7.5):(0.5 to 1.5):1:4:(1.5 to 2.5). Alternatively, an additive material such as a flux is appropriately added to such raw materials and mixed either in wet or dry conditions using a mixing machine. For the mixing machine, besides a ball mill which is commonly used in industrial processes, a vibration mill, a roll mill, a jet mill or other grinders may be used so as to grind the raw materials and increase their specific surface areas. In order to control the specific surface area of the resultant powder within a predetermined range, the materials may also be classified using a wet classifier such as a sedimentation tank, a hydrocyclone, a centrifugal separator or the like which is commonly used in industrial processes, or a dry classifier such as a cyclone or an air separator.

The above-mentioned mixture of the raw materials is put into a crucible made of SiC, quartz, alumina or the like, and is fired in a reducing atmosphere such as $N_2$, $H_2$. The firing may also be carried out in argon atmosphere, ammonia atmosphere, or the like. The firing is carried out at from 1000 to 1250° C. for 1 to 30 hours.

The fired mixture is subjected to grinding, filtration and/or other process to obtain the desired phosphor powder. Separation of solid and liquid components may be carried out by a process commonly used in industrial processes such as filtration, suction filtration, pressure filtration, centrifugal separation or decantation. The drying may be carried out by using an equipment such as a vacuum drier, a hot air-heating dryer, a conical dryer and a rotary evaporator, which is commonly used in industrial processes.

As to the raw materials for the phosphor, Si in the phosphor composition is preferably prepared as an oxide or nitride compound, but an imide compound, an amide compound and the like can also be used. Examples thereof include $SiO_2$, $Si_3N_4$, $Si(NH_2)_2$, $Mg_2Si$ and the like. On the other hand, a phosphor having good crystallinity and low cost can be provided by using Si as a single material. The purity of the Si of a raw material is preferably 2N or more, but other elements such as Li, Na, K, B, and Cu may be contained. Further, a portion of Si may also be substituted with Al, Ga, In, or Tl. Also, Si in the phosphor composition may be substituted with Ge, Sn, Ti, Zr, or Hf.

The alkaline earth metals, Mg, Ca, Sr, and Ba can be used in combination with a haloid salt, together with an oxide, a carbonate, a phosphate, a silicate, or the like, to obtain a predetermined halogen ratio. In addition, when introducing a halogen, an ammonium salt which contains a halogen can be used in place of a haloid salt of an alkaline earth metal.

On the other hand, it is preferable to use elemental Al for Al in the phosphor composition, but a part of Al can be substituted with Ga or In which is the Group III element, or V, Cr, or Co. A phosphor with good crystallinity can be obtained at a low cost when using elemental Al. A nitride of Al, an oxide of Al can also be used. Specifically, aluminum nitride AlN, aluminum oxide $Al_2O_3$ can be used. Purified raw materials are preferably used, but commercially available raw materials can also be used, and with this, the manufacturing processes can be simplified.

Further, Eu which serves as an activator is preferably used as a single substance, but a haloid salt, an oxide, a carbonate, a phosphate, a silicate, or the like can be used. A part of Eu may be substituted with Sc, Y, La, Ce, Pr, Nd, Sm, Gd, Tb, Dy, Ho, Er, Tm, Yb, Lu, or the like. When a mixture in which Eu is essential is used, the compounding ratio can be changed according to the requirement. As described above, when a part of Eu is substituted with other element, the other element functions as a co-activator. With this, the color tone can be changed and the light emitting characteristics can be adjusted. Europium mainly has an energy level with divalent and trivalent energy levels. In the phosphor of Embodiment 1, $Eu^{2+}$ is used as an activator.

A compound of Eu can be used as a raw material. In this case, a purified raw material is preferably used, but a commercially available raw material can also be used. Specifically, europium oxide $Eu_2O_3$, metallic europium, nitride europium, or the like can also be used as a compound of Eu. Also, an imide compound, an amide compound can also be used as the Eu of a raw material. Europium oxide is preferably those having high purity, and those which are commercially available can also be used.

An element additionally added as required is commonly added as an oxide or a hydroxide, but it is not limited thereto and a metal, a nitride, an imide, and amide, or other inorganic salts of the element may be employed. Also, the element may have been contained in other raw materials. It is preferable that the average particle size of each raw material is about 0.1 μm to about 15 μm, more preferably about 0.1 μm to about 10 μm, from the viewpoint of the reactivity with other raw materials, the control of the particle size at firing or after firing. If the particle size is larger than this range, an appropriate particle size can be obtained by carrying out crushing in a globe box in a nitrogen atmosphere The raw materials are preferably those that have been purified. This is because with which a purification step is not required, so that the manufacturing process of the phosphor can be simplified and a phosphor can be provided at a low cost.

EXAMPLES

In Examples 1 to 12, a chlorosilicate phosphor shown by $Ca_xEu_yMgSi_zO_aCl_b$ (in which, $6.5 \leq x \leq 8.0$; $0.01 \leq y \leq 2.0$; $3.7 \leq z \leq 4.3$; $a=x+y+1+2z-b/2$) being as an example of the phosphor according to Embodiment 1, the molar ratio of chlorine element to magnesium element is changed in a range of $1.0 \leq Cl/Mg \leq 1.9$, and the light emitting characteristics and the amount of dissolved chlorine at each composition ratio of the phosphor were measured. For the raw materials, $CaCO_3$, $Eu_2O_3$, MgO, $SiO_2$, and $CaCl_2$ were used in the same way in all examples. The charging composition ratio of the raw materials were weighed to satisfy each condition shown below, and the phosphors of Examples 1 to 12 were obtained respectively. Herein, the form of the following embodiments are intended as examples of a phosphor and a method of manufacturing the phosphor that are representative of the technology behind the present invention, and the invention is not limit the phosphor and the method of manufacturing the phosphor to that described below.

Example 1

In Example 1, each raw material is weighed to satisfy the charging composition ratio of $CaCO_3:Eu_2O_3:MgO:SiO_2:CaCl_2=6.25:0.25:1:4:1.25$ (Ca:Cl:Mg:Si:Eu=7.5:2.5:1:4:0.5).
Specifically, the powers shown below are weighed as the raw materials of the phosphor of Example 1. Herein, the purity of each raw material of the phosphor is assumed as 100%.
calcium carbonate ($CaCO_3$) . . . 110.42 g
europium oxide ($Eu_2O_3$) . . . 15.54 g
magnesium oxide (MgO) . . . 7.12 g
silicon oxide ($SiO_2$) . . . 42.40 g
calcium chloride ($CaCl_2$) . . . 24.52 g
The weighed raw materials are well mixed by dry ball milling, and then placed into a crucible and fired in a reducing atmosphere at 1150° C. for 5 hours. Crushing and wet dispersion were carried out on the fired material to obtain a phosphor powder. The composition ratio in the obtained phosphor was Ca:Cl:Mg:Si:Eu=7.65:1.84:1.00:4.30:0.50, and the content of Cl was 7.5 wt %. An example of reaction formula in generation of the phosphor is shown in the Reaction Formula 1 below.

$$6.25CaCO_3+1.25CaCl_2+0.25Eu_2O_3+MgO+4SiO_2 \rightarrow Ca_{7.5}Eu_{0.5}MgSi_4O_{16-x}Cl_{2-y}+6.25CO_2+0.125O_2+zCl \quad \text{Reaction Formula 1}$$

Here, the formula shown above is a theoretical formula based on the composition formula from the analysis values. The composition ratio in the actual product may somewhat vary since a part of oxygen or chlorine may be removed. Therefore, x and y indicates a difference between the analysis values and the actual composition, and z indicates the amount of chlorine evaporated.

Examples 2 to 12, Comparative Example 1

The phosphors of Examples 2 to 12 and Comparative Example 1 were obtained in a similar manner as in Example 1, except for weighing the raw materials based on their respective charging composition ratio shown in Table 1. The composition ratio of the phosphor determined by the elemental analysis on each obtained phosphors is also shown in Table 1.

In the chlorosilicate phosphors of the examples, the molar ratio of chlorine element to magnesium element is limited to a range of $1.0 \leq Cl/Mg \leq 1.9$, and this phosphor composition can be obtained by the charging composition ratio shown in Table 1. It is considered that the difference between the charging composition ratio and the obtained phosphor composition ratio occurs due to evaporation or dissolution of constituent elements during the manufacturing process. For example, the phosphor of Comparative Example 1 is a common chlorosilicate known in documents or the like, and it is a common knowledge that the charging composition ratio of chlorine to be "3" that is 1.5 times higher than "2" of the target phosphor composition ratio. The balance of charge can be improved by containing a halogen element in the phosphor as described above. On the other hand, in the phosphors according to the examples, the charging composition ratio of chlorine is controlled to 1.5 to 2.5, and further, that of calcium is also controlled to 6.5 to 7.5, that are lower than that of the charging composition ratio of Comparative Example 1.

The elemental analysis values (wt %) of the obtained phosphors according to Examples 1 to 12 are shown in Table 2 below. The analysis value of chlorine element in each example was 5.0 wt % to 8.0 wt %. In view of a case where the composition amount of europium is increased, a case where a part of chlorine is substituted with other halogen element, and further a case where various additives are mixed in, the content of chlorine relatively decreases, that is, it can be far less than the lowest value in Table 2 and it can be very small. Thus, the content of chlorine element in the obtained phosphor of 8.0 wt % is set as the highest limit, and the lower limit can be variously changed.

TABLE 2

| Example Number | Analysis Value (wt %) | | | | |
| --- | --- | --- | --- | --- | --- |
| | Ca | Cl | Mg | Si | Eu |
| Comparative Example 1 | 35 | 8.1 | 2.8 | 13 | 7.3 |
| Example 1 | 35.3 | 7.5 | 2.8 | 13.9 | 8.8 |
| Example 2 | 35.6 | 7.3 | 3 | 13.9 | 9.3 |
| Example 3 | 35 | 6.8 | 3.1 | 14.1 | 9.5 |
| Example 4 | 35.9 | 7.7 | 2.9 | 13.6 | 8.9 |
| Example 5 | 35.2 | 7.2 | 2.9 | 13.7 | 9 |
| Example 6 | 34.5 | 6.6 | 3 | 14.1 | 9.3 |
| Example 7 | 34.2 | 6.3 | 3 | 14.3 | 9.4 |
| Example 8 | 35.6 | 7.4 | 2.9 | 13.9 | 9 |
| Example 9 | 35.1 | 7 | 2.9 | 13.9 | 9.3 |
| Example 10 | 35 | 6.7 | 3 | 14 | 9.5 |

TABLE 1

| Example Number | Charging Composition Ratio | | | | | Composition Ratio from Analysis Value (Mg Standard) | | | | |
| --- | --- | --- | --- | --- | --- | --- | --- | --- | --- | --- |
| | Ca | Cl | Mg | Si | Eu | Ca | Cl | Mg | Si | Eu |
| Comparative Example 1 | 8.5 | 3 | 1 | 4 | 0.5 | 7.58 | 1.98 | 1.00 | 4.02 | 0.42 |
| Example 1 | 7.5 | 2.5 | 1 | 4 | 0.5 | 7.65 | 1.84 | 1.00 | 4.30 | 0.50 |
| Example 2 | 7.3 | 2.5 | 1 | 4 | 0.5 | 7.20 | 1.67 | 1.00 | 4.01 | 0.50 |
| Example 3 | 7.13 | 2.5 | 1 | 4 | 0.5 | 6.85 | 1.50 | 1.00 | 3.94 | 0.49 |
| Example 4 | 7.5 | 2.25 | 1 | 4 | 0.5 | 7.51 | 1.82 | 1.00 | 4.06 | 0.49 |
| Example 5 | 7.3 | 2.25 | 1 | 4 | 0.5 | 7.36 | 1.70 | 1.00 | 4.09 | 0.50 |
| Example 6 | 7.13 | 2.25 | 1 | 4 | 0.5 | 6.97 | 1.51 | 1.00 | 4.07 | 0.50 |
| Example 7 | 7 | 2.25 | 1 | 4 | 0.5 | 6.91 | 1.44 | 1.00 | 4.13 | 0.50 |
| Example 8 | 7.3 | 2 | 1 | 4 | 0.5 | 7.44 | 1.75 | 1.00 | 4.15 | 0.50 |
| Example 9 | 7.1 | 2 | 1 | 4 | 0.5 | 7.34 | 1.65 | 1.00 | 4.15 | 0.51 |
| Example 10 | 7 | 2 | 1 | 4 | 0.5 | 7.08 | 1.53 | 1.00 | 4.04 | 0.51 |
| Example 11 | 7 | 1.75 | 1 | 4 | 0.5 | 7.03 | 1.37 | 1.00 | 4.15 | 0.50 |
| Example 12 | 7 | 1.5 | 1 | 4 | 0.5 | 7.01 | 1.28 | 1.00 | 4.10 | 0.51 |

TABLE 2-continued

| Example Number | Analysis Value (wt %) | | | | |
|---|---|---|---|---|---|
| | Ca | Cl | Mg | Si | Eu |
| Example 11 | 34.8 | 6 | 3 | 14.4 | 9.3 |
| Example 12 | 34.7 | 5.6 | 3 | 14.2 | 9.5 |

Table 3 below shows the characteristics of each phosphor of Examples 1 to 1.2 and Comparative Example 1. Specifically shows particle size, chromaticity coordinates at 460 nm (corresponds to color tone) and luminance and peak wavelength, and dissolved amount of Cl. Herein, the term "dissolved amount of Cl" means the amount of the dissolved chlorine which is a constituent element of the phosphor. Specifically indicates the concentration (ppm) of chlorine in the solution obtained such that each phosphor respectively obtained in Comparative Example 1 and Example 1 to 12 is stirred to be 4 wt % and deionized, and then placed on a hot plate kept at 80° C. and stirred for 24 hours. Also, a graph providing comparison of the dissolved amount of Cl in each example is shown in FIG. 1.

TABLE 3

| Example Number | 460 nm excitation | | | | Cl |
|---|---|---|---|---|---|
| | Particle Size Dm (μm) | Chromaticity coordinate x | Chromaticity coordinate y | Luminance (%) | Peak wavelength (nm) | dissolved amount (ppm) |
| Comparative Example 1 | 15.02 | 0.217 | 0.659 | 100 | 515 | 8400 |
| Example 1 | 13.16 | 0.252 | 0.661 | 138.6 | 522 | 620 |
| Example 2 | 13.42 | 0.263 | 0.660 | 140.4 | 524 | 370 |
| Example 3 | 13.89 | 0.261 | 0.659 | 133.7 | 523 | 570 |
| Example 4 | 12.4 | 0.259 | 0.660 | 143.2 | 523 | 390 |
| Example 5 | 15.56 | 0.257 | 0.659 | 140.0 | 523 | 490 |
| Example 6 | 17.06 | 0.251 | 0.659 | 128.3 | 521 | 810 |
| Example 7 | 19.15 | 0.249 | 0.659 | 129.2 | 521 | 1500 |
| Example 8 | 14.53 | 0.263 | 0.658 | 138.9 | 524 | 300 |
| Example 9 | 15.22 | 0.261 | 0.659 | 134.9 | 524 | 420 |
| Example 10 | 15.68 | 0.261 | 0.658 | 133.3 | 523 | 620 |
| Example 11 | 15.9 | 0.264 | 0.658 | 132.7 | 524 | 250 |
| Example 12 | 16.24 | 0.263 | 0.658 | 134.3 | 523 | 190 |

It can be seen from Table 3 and FIG. 1 that the amount of dissolved chlorine of the phosphor of Examples 1 to 12 is significantly reduced compared to that of Comparative Example 1. Specifically, it is 1500 ppm or less, which is ⅕ or less, or 18% corresponds to 8400 ppm of Comparative Example. Thus, halogenation of adjacent members due to dissolved chlorine contained in the phosphor can be significantly suppressed. This is obtained such that limiting the molar ratio of chlorine element in the charging composition ratio in the above described range and reducing excess chlorine at the time of firing, the molar ratio of chlorine element in the phosphor composition ratio is set to $1.0 \leqq Cl/Mg \leqq 1.9$ or/and the content of chlorine in the phosphor is set to 8.0 wt % or less. That is, the molar ratio of chlorine contained in a compound can be made smaller than its theoretical value. In a crystal structure having chlorine less than its theoretical value, occurrence of defects is presumed at a part of the Cl sites. Consequently, it is thought that chlorine is stabilized in the crystal due to a decrease in chlorine, which results in reduction of the amount of the dissolved chlorine.

Also, as shown in Table 3, in the phosphors of Examples, the luminance was also greatly improved compared to that in Comparative Example, specifically, improvement of about 30% or more was observed. Therefore, it is recognized that the phosphors of Examples in which the composition ratio of chlorine is limited in the above described range are advantageous compared to that of Comparative Example 1 in view of the light emitting characteristics and the amount of dissolved Cl.

(Particle Size)

As shown in Table 3, the average particle size of the phosphors of Examples was 5 μm to 50 μm. The particle size means an average particle size obtained by way of electrical resistance method using a Coulter counter. Specifically, a phosphor is dispersed in a disodium phosphate solution and the particle size is obtained based on the electric resistance which occurs when particles pass a tiny hole of an aperture tube.

Also as shown in Table 3, the emission peaks of the phosphors of Examples shift to longer wavelengths than that of the emission peak of the phosphor of Comparative Example 1. Specifically, the emission peak of the phosphor of Comparative Example 1 has a wavelength of 515 nm, on the other hand, the emission peaks of the phosphors of Examples shift 6 nm or more to longer wavelengths. Further, FIG. 2 shows the emission spectra of the phosphors of Comparative Example 1 and Examples 1 to 5 excited at 460 nm, plotted on a single graph. FIG. 3 to FIG. 8 respectively show each of the emission spectra of phosphors of Comparative Example 1 and Examples 1 to 5 shown in FIG. 2. As shown in FIG. 2, the emission spectra of Examples 1 to 5 have approximately the same shape and the emission peaks locate from 495 nm to 548 nm. The emission spectra of Examples are improved in terms of output energy, and shifted toward longer wavelength compared to that of Comparative Example 1. Particularly, in the emission spectra of Examples shown in FIG. 2 to FIG. 8, the peak values are around 525 nm, that locate closer to the ideal peak value of 525 nm to 540 nm for the G component of three band spectrum constituting a white light, compared to that of Comparative Example 1. That is, employing the phosphors of Examples in a three-band light emitting device (light emitting device capable of reproducing white light by mixing colors of R•G•B) enables to provide an effective G component and a white light with excellent light emitting characteristics can be obtained.

Further, FIG. 9 shows the reflection spectra of the phosphors of Comparative Example 1 and Examples 1 to 5 plotted on a single graph. FIG. 10 to FIG. 15 respectively show a reflection spectrum of each phosphor according to Comparative Example 1 and Examples 1 to 5 shown in FIG. 9. Further, FIG. 16 shows the excitation spectra of the phosphors of Comparative Example 1 and Examples 1 to 5 plotted on a single graph. FIG. 17 to FIG. 22 respectively show each of the excitation spectra of phosphors of Comparative Example 1 and Examples 1 to 5. In addition, FIG. 23 to FIG. 27 respectively show the 1000-fold magnified photograph of phosphors of Comparative Example 1 and Examples 1, 2, 4, and 5.

Comparative Examples 2 to 5

Next, as Comparative Examples 2 to 5, a part of calcium carbonate, which is a raw material of the phosphor, was substituted with strontium carbonate or barium carbonate, and each raw material was weighed at the charging composition ratio shown in Table 4 below, and the method of manufacturing was carried out in the same manner as in Example 1. Each phosphor obtained in Comparative Examples 2 to 5 has a part of Ca which is a compositional element substituted with Sr or Ba, and changes in color tone were observed compared to the phosphors of Examples 1 to 12. Table 4 also shows the composition ratios obtained from the analysis values based on Mg. From Table 4 one can see that the amount of halogen in the composition of each phosphor of Comparative Examples 2 to 5 is less compared to that in the composition of the phosphors of Examples 1 to 12. Table 5 shows the analysis values (wt %) and the light emitting characteristics excited at 460 nm of each Comparative Example. As described above, it is found that too little halogen in the phosphor composition results in degradation of the characteristics.

TABLE 4

| Example Number | Charging Composition Ratio | | | | | | | Composition Ratio from Analysis Value (Mg Standard) | | | | | | |
|---|---|---|---|---|---|---|---|---|---|---|---|---|---|---|
| | Ca | Cl | Sr | Ba | Mg | Si | Eu | Ca | Cl | Sr | Ba | Mg | Si | Eu |
| Comparative Example 2 | 6.5 | 2.5 | 1 | 0 | 1 | 4 | 0.5 | 5.88 | 0.08 | 0.50 | — | 1.00 | 4.01 | 0.51 |
| Comparative Example 3 | 5.5 | 2.5 | 2 | 0 | 1 | 4 | 0.5 | 5.47 | 0.13 | 1.19 | — | 1.00 | 4.07 | 0.51 |
| Comparative Example 4 | 6.5 | 2.5 | 0 | 1 | 1 | 4 | 0.5 | 6.14 | 0.01 | — | 0.09 | 1.00 | 3.92 | 0.48 |
| Comparative Example 5 | 5.5 | 2.5 | 0 | 2 | 1 | 4 | 0.5 | 5.55 | (0.00) | — | 0.48 | 1.00 | 3.80 | 0.48 |

TABLE 5

| Example Number | Analysis value (wt %) | | | | | | | 460 nm excitation | | | |
|---|---|---|---|---|---|---|---|---|---|---|---|
| | | | | | | | | Chromaticity | Chromaticity | Luminance | Peak wavelength |
| | Ca | Cl | Sr | Ba | Mg | Si | Eu | coordinate x | coordinate y | (%) | (nm) |
| Comparative Example 2 | 31.1 | 0.4 | 5.7 | — | 3.2 | 14.9 | 10.2 | 0.323 | 0.616 | 36.6 | 539 |
| Comparative Example 3 | 27.5 | 0.6 | 13.0 | — | 3.0 | 14.3 | 9.7 | 0.325 | 0.616 | 28.7 | 533 |
| Comparative Example 4 | 34.6 | 0.0 | — | 1.7 | 3.4 | 15.5 | 10.2 | 0.324 | 0.607 | 18.7 | 533 |
| Comparative Example 5 | 30.8 | (0.0) | — | 9.1 | 3.4 | 14.8 | 10.1 | 0.386 | 0.576 | 14.1 | 545 |

Examples 13 to 16, Comparative Examples 6 and 7

In Examples 13 to 16 and Comparative Examples 6 and 7, in the step of manufacturing the phosphor of Example 1, calcium chloride was substituted with calcium bromide or calcium fluoride and each raw material was weighed at the charging composition ratio shown in Table 6 below, and synthesis was carried out in the same manner as in Example 1. As indicated in Table 7, in each phosphor of Examples 13 to 16, it was confirmed that the emission spectrum excited at 460 nm can be shifted to longer wavelength side by substituting a part or all of the chlorine with fluorine or bromine. In Comparative Examples 6 and 7 where chlorine was not included in the charging step, degradation of luminance was observed.

TABLE 6

| Example Number | Charging Composition Ratio | | | | | | | Composition Ratio from Analysis Value (Mg Standard) | | | | | | |
|---|---|---|---|---|---|---|---|---|---|---|---|---|---|---|
| | Ca | Cl | Br | F | Mg | Si | Eu | Ca | Cl | Br | F | Mg | Si | Eu |
| Example 13 | 7.5 | 2.25 | 0 | 0.25 | 1 | 4 | 0.5 | 7.03 | 1.42 | — | 0.24 | 1.00 | 4.00 | 0.61 |
| Example 14 | 7.5 | 1.75 | 0 | 0.75 | 1 | 4 | 0.5 | 7.21 | 0.88 | — | 0.73 | 1.00 | 4.14 | 0.63 |
| Example 15 | 7.5 | 2.25 | 0.25 | 0 | 1 | 4 | 0.5 | 6.95 | 1.39 | 0.04 | — | 1.00 | 4.10 | 0.48 |
| Example 16 | 7.5 | 1.75 | 0.75 | 0 | 1 | 4 | 0.5 | 6.06 | 0.77 | 0.08 | — | 1.00 | 3.85 | 0.46 |
| Comparative Example 6 | 7.5 | 0 | 0 | 2.50 | 1 | 4 | 0.5 | 7.82 | 0.07 | — | 2.10 | 1.00 | 4.14 | 0.52 |
| Comparative Example 7 | 7.5 | 0 | 2.5 | 0 | 1 | 4 | 0.5 | 6.36 | 0.02 | 0.04 | — | 1.00 | 4.24 | 0.49 |

TABLE 7

| Example Number | Analysis value (wt %) | | | | | | | 460 nm excitation | | | |
|---|---|---|---|---|---|---|---|---|---|---|---|
| | Ca | Cl | Br | F | Mg | Si | Eu | Chromaticity coordinate x | Chromaticity coordinate y | Luminance (%) | Peak wavelength (nm) |
| Example 13 | 33.6 | 6.0 | — | 0.54 | 2.9 | 13.4 | 11.1 | 0.297 | 0.631 | 85.2 | 522 |
| Example 14 | 33.3 | 3.6 | — | 1.6 | 2.8 | 13.4 | 11.0 | 0.318 | 0.614 | 59.6 | 524 |
| Example 15 | 34.4 | 6.10 | 0.40 | — | 3.0 | 14.2 | 9.0 | 0.247 | 0.663 | 125.8 | 521 |
| Example 16 | 31 | 3.50 | 0.86 | — | 3.1 | 13.8 | 9.0 | 0.243 | 0.664 | 114.5 | 520 |
| Comparative Example 6 | 36.1 | 0.27 | — | 4.6 | 2.8 | 13.4 | 9.1 | 0.411 | 0.554 | 13.5 | 545 |
| Comparative Example 7 | 32.5 | 0.10 | 0.41 | — | 3.1 | 15.2 | 9.5 | 0.341 | 0.585 | 35.9 | 528 |

Examples 17 to 20

Further, in Examples 17 to 20, synthesis was carried out in the same manner as the synthesis condition of the phosphor of Example 1, except that the firing temperature was changed to 1170° C. The charged composition ratio of each raw material is as shown in Table 8 below, and the light emitting characteristics of each obtained phosphor is also shown in Table 9. It was confirmed in Examples 17 to 20 that in the emission spectra excited at 460 nm, varying the charging ratio of europium to calcium enables to realize improvement in luminance and shift control to a longer wavelength side.

TABLE 8

| Example Number | Charging Composition Ratio | | | | | Composition Ratio from Analysis Value (Mg Standard) | | | | |
|---|---|---|---|---|---|---|---|---|---|---|
| | Ca | Cl | Mg | Si | Eu | Ca | Cl | Mg | Si | Eu |
| Example 17 | 7.5 | 2.5 | 1 | 4 | 0.5 | 7.44 | 1.75 | 1.00 | 4.06 | 0.53 |
| Example 18 | 7.4 | 2.5 | 1 | 4 | 0.6 | 7.07 | 1.68 | 1.00 | 3.97 | 0.63 |
| Example 19 | 7.3 | 2.5 | 1 | 4 | 0.7 | 6.97 | 1.59 | 1.00 | 4.05 | 0.78 |
| Example 20 | 7.2 | 2.5 | 1 | 4 | 0.8 | 7.00 | 1.56 | 1.00 | 4.26 | 1.03 |

TABLE 9

| Example Number | Analysis value (wt %) | | | | | 460 nm excitation | | | |
|---|---|---|---|---|---|---|---|---|---|
| | | | | | | Chromaticity coordinate x | Chromaticity coordinate y | Luminance (%) | Peak wavelength (nm) |
| | Ca | Cl | Mg | Si | Eu | | | | |
| Example 17 | 35.6 | 7.4 | 2.9 | 13.6 | 9.6 | 0.257 | 0.664 | 143.1 | 523 |
| Example 18 | 33.8 | 7.1 | 2.9 | 13.3 | 11.5 | 0.270 | 0.662 | 140.0 | 525 |
| Example 19 | 32.2 | 6.5 | 2.8 | 13.1 | 13.7 | 0.282 | 0.659 | 132.8 | 527 |
| Example 20 | 30.0 | 5.9 | 2.6 | 12.8 | 16.8 | 0.293 | 0.653 | 118.8 | 529 |

Examples 21 to 25

In Examples 21 to 25, in the step of manufacturing the phosphor of Example 1, silicon oxide ($SiO_2$) was substituted with silicon nitride ($Si_3N_4$) and each raw material was weighed at the charging composition ratio shown in Table 10 below, and synthesis was carried out in the same manner as in Example 1. It was confirmed that in each phosphor of Examples 21 to 25, as indicated in Table 11, a part of oxygen was substituted with nitrogen and a luminance comparable to that in Example 1 was obtained.

Examples 26 to 28

In Examples 26 to 28, in the step of manufacturing the phosphor of Example 1, silicon oxide ($SiO_2$) was substituted with aluminum nitride (AlN) and each raw material was weighed at the charging composition ratio shown in Table 12 below, and synthesis was carried out in the same manner as in Example 1. In each phosphor of Examples 26 to 28, as indicated in Table 13, a part of Si was substituted with Al and further, a part of oxygen is substituted with nitrogen. Luminance comparable to that in Example 1 was confirmed.

TABLE 10

| Example Number | Charging Composition Ratio | | | | | | Composition Ratio from Analysis Value (Mg Standard) | | | | |
|---|---|---|---|---|---|---|---|---|---|---|---|
| | Ca | Cl | Mg | Si | Eu | N | Ca | Cl | Mg | Si | Eu |
| Example 21 | 7.5 | 2.5 | 1 | 4 | 0.5 | 0.53 | 7.30 | 1.73 | 1.00 | 4.00 | 0.50 |
| Example 22 | 7.5 | 2.5 | 1 | 4 | 0.5 | 1.07 | 7.30 | 1.71 | 1.00 | 4.06 | 0.50 |
| Example 23 | 7.5 | 2.5 | 1 | 4 | 0.5 | 1.60 | 7.26 | 1.73 | 1.00 | 3.97 | 0.50 |
| Example 24 | 7.5 | 2.5 | 1 | 4 | 0.5 | 2.13 | 7.17 | 1.68 | 1.00 | 4.03 | 0.50 |
| Example 25 | 7.5 | 2.5 | 1 | 4 | 0.5 | 2.67 | 7.08 | 1.69 | 1.00 | 3.95 | 0.47 |

TABLE 11

| Example Number | Analysis value (wt %) | | | | | 460 nm excitation | | | |
|---|---|---|---|---|---|---|---|---|---|
| | | | | | | Chromaticity coordinate x | Chromaticity coordinate y | Luminance (%) | Peak wavelength (nm) |
| | Ca | Cl | Mg | Si | Eu | | | | |
| Example 21 | 34.9 | 7.3 | 2.9 | 13.4 | 9.1 | 0.249 | 0.661 | 141.3 | 522 |
| Example 22 | 34.9 | 7.25 | 2.9 | 13.6 | 9 | 0.250 | 0.661 | 140.4 | 522 |
| Example 23 | 34.7 | 7.3 | 2.9 | 13.3 | 9 | 0.250 | 0.661 | 139.8 | 522 |
| Example 24 | 34.3 | 7.1 | 2.9 | 13.5 | 9 | 0.245 | 0.660 | 132.7 | 521 |
| Example 25 | 35 | 7.4 | 3 | 13.7 | 8.8 | 0.256 | 0.658 | 128.9 | 522 |

TABLE 12

| Example Number | Charging Composition Ratio | | | | | | | Composition Ratio from Analysis Value (Mg Standard) | | | | | |
|---|---|---|---|---|---|---|---|---|---|---|---|---|---|
| | Ca | Cl | Mg | Si | Eu | Al | N | Ca | Cl | Mg | Si | Eu | Al |
| Example 26 | 7.5 | 2.5 | 1 | 3.96 | 0.5 | 0.04 | 0.04 | 7.30 | 1.75 | 1.00 | 3.97 | 0.50 | 0.04 |
| Example 27 | 7.5 | 2.5 | 1 | 3.92 | 0.5 | 0.08 | 0.08 | 7.32 | 1.75 | 1.00 | 4.00 | 0.50 | 0.08 |
| Example 28 | 7.5 | 2.5 | 1 | 3.8 | 0.5 | 0.2 | 0.2 | 7.21 | 1.75 | 1.00 | 3.91 | 0.49 | 0.21 |

TABLE 13

| Example Number | Analysis value (wt %) | | | | | | 460 nm excitation | | | |
|---|---|---|---|---|---|---|---|---|---|---|
| | Ca | Cl | Mg | Si | Eu | Al | Chromaticity coordinate x | Chromaticity coordinate y | Luminance (%) | Peak wavelength (nm) |
| Example 26 | 34.9 | 7.4 | 2.9 | 13.3 | 9 | 0.14 | 0.248 | 0.663 | 136.0 | 521 |
| Example 27 | 35 | 7.4 | 2.9 | 13.4 | 9 | 0.25 | 0.249 | 0.661 | 131.0 | 521 |
| Example 28 | 34.5 | 7.4 | 2.9 | 13.1 | 8.8 | 0.66 | 0.253 | 0.654 | 107.1 | 521 |

Examples 29 to 32

Further as Examples 29 to 32, phosphors having reduced amount of Eu, which is an activator, compared to that in Examples 17 to 20 were formed. Each raw material is weighed at the charging composition ratio shown in Table 14 and a method of manufacturing in the same manner as in Examples 17 to 20 were carried out. The light emitting characteristics excited at 460 nm of each of the phosphors obtained in Examples 29 to 32 are shown in Table 15. As indicated in this table, the emission peaks shifted to shorter wavelength side compared to Examples 17 to 20.

TABLE 14

| Example Number | Charging Composition Ratio | | | | | Composition Ratio from Analysis Value (Mg Standard) | | | | |
|---|---|---|---|---|---|---|---|---|---|---|
| | Ca | Cl | Mg | Si | Eu | Ca | Cl | Mg | Si | Eu |
| Example 29 | 7.9 | 2.5 | 1 | 4 | 0.1 | 7.73 | 1.77 | 1.00 | 4.02 | 0.11 |
| Example 30 | 7.8 | 2.5 | 1 | 4 | 0.2 | 7.78 | 1.78 | 1.00 | 4.10 | 0.22 |
| Example 31 | 7.7 | 2.5 | 1 | 4 | 0.3 | 7.53 | 1.82 | 1.00 | 4.18 | 0.32 |
| Example 32 | 7.6 | 2.5 | 1 | 4 | 0.4 | 7.49 | 1.77 | 1.00 | 4.12 | 0.41 |

TABLE 15

| Example Number | Analysis value (wt %) | | | | | 460 nm excitation | | | |
|---|---|---|---|---|---|---|---|---|---|
| | Ca | Cl | Mg | Si | Eu | Chromaticity coordinate x | Chromaticity coordinate y | Luminance (%) | Peak wavelength (nm) |
| Example 29 | 39.5 | 8 | 3.1 | 14.4 | 2.1 | 0.170 | 0.652 | 85.7 | 510 |
| Example 30 | 38.5 | 7.8 | 3 | 14.2 | 4.1 | 0.189 | 0.658 | 107.5 | 511 |
| Example 31 | 36.0 | 7.7 | 2.9 | 14.0 | 5.8 | 0.211 | 0.662 | 121.9 | 514 |
| Example 32 | 35.8 | 7.5 | 2.9 | 13.8 | 7.4 | 0.229 | 0.662 | 128.0 | 517 |

Examples 33 to 36

Further, as Examples 33 to 36, a part of calcium carbonate, which is a raw material of the phosphor, was substituted with manganese carbonate, and each raw material was weighed at the charging composition ratio shown in Table 16, and the method of manufacturing was carried out in the same manner as in Example 1. The composition ratio was calculated based on the charged amount of Mg. The light emitting characteristics of the phosphors of Examples 33 to 36, excited at 460 nm are also shown in Table 17 and the emission spectra thereof are shown in FIG. 37. Each obtained phosphor of Examples 33 to 36 has a part of Ca, which is a compositional element" substituted with Mn and the emission peaks thereof were able to be made longer than the cases activated only with Eu, as shown in Table 17. The amount of substitution of a part of Ca with Mn is preferably such that Mn to Ca is 0.0001% or more and 10% or less, more preferably 0.01% or more and 1% or less.

Examples 37 to 40

Further, as Examples 37 to 40, in the step of manufacturing the phosphor of Example 17, the method of manufacturing was carried out in the same manner as in Example 1, except that a part of magnesium oxide, which is a raw material of the phosphor, was substituted with manganese carbonate, and each raw material was weighed at the charging composition ratio shown in Table 16. The light emitting characteristics of the phosphors of Examples 37 to 40, excited at 460 nm are also shown in Table 17 and the emission spectra thereof are shown in FIG. 38. Each obtained phosphor of Examples 37 to 40 has a part of Mg, which is a compositional element" substituted with Mn and the emission peaks thereof were able to be made longer than that of the phosphors of Examples 38 to 40, as shown in Table 17. Particularly, the effect of shifting to a longer wavelength was significant in Examples 38 to 40. Also, substituting a part of Mg with Mn allowed reducing the half maximum full-width of the emission spectrum. The amount of substitution of a part of Mg with Mn is preferably such that Mn to Mg is 0.01% or more and 50% or less, more preferably 0.1% or more and 301% or less, and further preferably 1% or more and 20% or less.

TABLE 16

| Example Number | Charging Composition Ratio | | | | | | Composition Ratio from Analysis Value (Mg Standard) | | | | | |
|---|---|---|---|---|---|---|---|---|---|---|---|---|
| | Ca | Cl | Mg | Si | Eu | Mn | Ca | Cl | Mg | Si | Eu | Mn |
| Example 33 | 7.45 | 2.5 | 1 | 4 | 0.5 | 0.05 | 7.05 | 1.62 | 1.00 | 3.98 | 0.47 | 0.004 |
| Example 34 | 7.4 | 2.5 | 1 | 4 | 0.5 | 0.10 | 7.16 | 1.60 | 1.00 | 4.01 | 0.48 | 0.007 |
| Example 35 | 7.3 | 2.5 | 1 | 4 | 0.5 | 0.20 | 7.20 | 1.55 | 1.00 | 4.07 | 0.48 | 0.019 |
| Example 36 | 7.2 | 2.5 | 1 | 4 | 0.5 | 0.30 | 7.12 | 1.51 | 1.00 | 4.07 | 0.49 | 0.047 |
| Example 37 | 7.5 | 2.5 | 0.95 | 4 | 0.5 | 0.05 | 7.45 | 1.79 | 0.98 | 4.17 | 0.50 | 0.02 |
| Example 38 | 7.5 | 2.5 | 0.9 | 4 | 0.5 | 0.10 | 7.88 | 1.90 | 0.96 | 4.42 | 0.53 | 0.04 |
| Example 39 | 7.5 | 2.5 | 0.8 | 4 | 0.5 | 0.20 | 8.32 | 1.89 | 0.93 | 4.66 | 0.56 | 0.07 |
| Example 40 | 7.5 | 2.5 | 0.7 | 4 | 0.5 | 0.30 | 9.30 | 1.88 | 0.90 | 5.15 | 0.62 | 0.10 |

TABLE 17

| Example Number | Analysis value (wt %) | | | | | | 460 nm excitation | | | |
|---|---|---|---|---|---|---|---|---|---|---|
| | Ca | Cl | Mg | Si | Eu | Mn | Chromaticity coordinate x | Chromaticity coordinate y | Luminance (%) | Peak wavelength (nm) |
| Example 33 | 34.9 | 7.1 | 3.0 | 13.8 | 8.9 | 0.03 | 0.262 | 0.661 | 134.6 | 523 |
| Example 34 | 35.4 | 7 | 3.0 | 13.9 | 9 | 0.05 | 0.270 | 0.657 | 130.4 | 523 |
| Example 35 | 35.6 | 6.8 | 3.0 | 14.1 | 9 | 0.13 | 0.284 | 0.649 | 122.5 | 525 |
| Example 36 | 35.2 | 6.6 | 3.0 | 14.1 | 9.2 | 0.32 | 0.306 | 0.637 | 112.2 | 535 |
| Example 37 | 35.2 | 7.5 | 2.8 | 13.8 | 9 | 0.15 | 0.285 | 0.646 | 126.1 | 524 |
| Example 38 | 35.1 | 7.5 | 2.6 | 13.8 | 9 | 0.23 | 0.300 | 0.648 | 138.4 | 543 |
| Example 39 | 35.4 | 7.1 | 2.4 | 13.9 | 9 | 0.41 | 0.326 | 0.635 | 121.6 | 547 |
| Example 40 | 35.8 | 6.4 | 2.1 | 13.9 | 9 | 0.53 | 0.337 | 0.629 | 112.3 | 547 |

Examples 41 to 48

Further, as Examples 41 to 48, a part of calcium carbonate, which is a raw material of the phosphor, was substituted with strontium carbonate or barium carbonate, and each raw material was weighed at the charging composition ratio shown in Table 18, and the method of manufacturing was carried out in the same manner as in Example 1. Each phosphor obtained in Examples 41 to 48 has a part of Ca, which is a compositional element, substituted with Sr or Ba. The amount of Sr, Ba is preferably 13% or less, more preferably 10% or less, and further preferably 6% or less, with respect to Ca. The light emitting characteristics of the phosphors of Examples 41 to 48 are also shown in Table 18, and the luminance comparable to that in Example 1 was obtained from the emission spectra thereof excited at 460 nm.

TABLE 18

| Example Number | Analysis value (wt %) | | | | | | | 460 nm excitation | | | |
|---|---|---|---|---|---|---|---|---|---|---|---|
| | Ca | Cl | Sr | Ba | Mg | Si | Eu | Chromaticity coordinate x | Chromaticity coordinate y | Luminance (%) | Peak wavelength (nm) |
| Example 41 | 7.45 | 2.5 | 0.05 | 0 | 1 | 4 | 0.5 | 0.256 | 0.665 | 137.4 | 523 |
| Example 42 | 7.4 | 2.5 | 0.1 | 0 | 1 | 4 | 0.5 | 0.257 | 0.665 | 135.8 | 523 |
| Example 43 | 7.3 | 2.5 | 0.2 | 0 | 1 | 4 | 0.5 | 0.258 | 0.665 | 136.7 | 523 |
| Example 44 | 7.1 | 2.5 | 0.4 | 0 | 1 | 4 | 0.5 | 0.258 | 0.667 | 126.7 | 523 |
| Example 45 | 7.45 | 2.5 | 0 | 0.05 | 1 | 4 | 0.5 | 0.253 | 0.665 | 125.5 | 522 |
| Example 46 | 7.4 | 2.5 | 0 | 0.1 | 1 | 4 | 0.5 | 0.254 | 0.665 | 119 | 523 |
| Example 47 | 7.3 | 2.5 | 0 | 0.2 | 1 | 4 | 0.5 | 0.255 | 0.664 | 115.5 | 523 |
| Example 48 | 7.1 | 2.5 | 0 | 0.4 | 1 | 4 | 0.5 | 0.254 | 0.661 | 101.2 | 522 |

(Light Emitting Device)

Next, the light emitting device employing the phosphor of Embodiment 1 as a wavelength converting member will be described. Examples of the light emitting device include a lighting apparatus such as a fluorescent lamp, a display device such as a display and radar, a backlight for liquid crystal. In the embodiments below, exemplified is a light emitting device having a light emitting element as an excitation light source which is capable of emitting light from near-ultraviolet to visible light in short-wavelength region. Light emitting elements are small in size and have good power efficiency, and can emit light of a bright color. Also, the light emitting elements are semiconductor elements, therefore, are free from burn out and the like. Further, they are excellent in initial drive performance and have excellent durability for vibrations and/or repeated ON/OFF operations. Also, the light emitting devices preferably have a combination of a light emitting element and chlorosilicate phosphor having excellent light emitting characteristics.

The excitation light source has a main emission peak in ultraviolet region which is of low luminosity. A luminosity relationship exists between the visual sensitivity of the human eye and the wavelength of light. Luminosity is the highest at light of 555 nm, and decreases toward the shorter or longer wavelength side. For example, light in ultraviolet visible light region used as the excitation light source is of low luminosity range, thus, the light emission color of the fluorescent material which is used substantially determine the emission color of the light emitting device. Even in the case where a color shift of the light emitting element occurs due to change in the applied current or the like, the color shift of the fluorescent material that emits light of visible light region can be markedly suppressed. As a result, a light emitting device with small tone variation can be provided. This is because, generally, the ultraviolet region corresponds to wavelengths shorter than 380 nm or 400 nm, and light of 420 nm or shorter is almost invisible in terms of luminosity, so that the color tone will not be greatly affected. It is also because light of shorter wavelength has higher energy than light of longer wavelength.

In the embodiments below, an excitation light source having a main emission peak in a region of the shorter wavelength side of visible light can be used. In a light emitting device having its excitation light source covered with a coating member containing a fluorescent material, light emitted from the excitation light source passes through without being absorbed by the fluorescent material and the passed light is emitted to outside from the coating member. In a case where visible light of shorter wavelength is used as the excitation light source, the light emitted to outside can be effectively utilized. Accordingly, the loss of light which is emitted from the light emitting device can be reduced and a light emitting device of high efficiency can be provided. This showed that in the present embodiment, an excitation light source having a main light emission peak in a range from 420 nm to 500 nm can also be used. In this case, blue light can be emitted. In addition, light of relatively short wavelength is not used, so that a light emitting device having less harmful effects to the human body can be provided. In addition, since light with relatively short wavelength is not used, it is possible to provide a light emitting device with a less deleterious effect on humans.

Other than a semiconductor light emitting element, an excitation light source such as a mercury lamp which has been used in an existing fluorescent lamp and which has an emission peak wavelength in a region from ultraviolet to a short wavelength region of visible light can also be appropriately used as the excitation light source. In the present specification "light emitting element" includes not only an element which emits visible light but also an element which emits near-ultraviolet light, far-ultraviolet light, or the like. Further, the term "principal surface" means, in the surfaces of each constituent component of the light emitting device such as a package, a lead electrode, or the like, a surface at the light emitting surface side from where light of the semiconductor light emitting element is extracted.

There are various types such as a shell shape type and a surface mount type in the light emitting devices mounted with a light emitting element. Typically, "shell shape type" refers to a type in which the resin which forms the outer surface is made into a shell shape. "Surface mount type" refers to a type formed with a light emitting element and a resin filled in a housing recess. Various light emitting devices will be exemplified below.

Embodiment 2

FIG. 28 is a view showing the light emitting device 60 according to Embodiment 2. FIG. 28(a) is a perspective view of the light emitting device 60 and FIG. 28(b) is a cross-sectional view of the light emitting device 60 taken along a line XXVIIIB-XXVIIIB' of FIG. 28(a). The light emitting device 60 is a side-view type light emitting device which is a kind of surface-mount type. A side view type refers to a type of light emitting device which emits light from a side surface side adjacent to the mounting surface of the light emitting device, and which can be made further thinner.

Specifically, the light emitting device 60 of FIG. 28 has a recess 14 and a light emitting element 2 housed in the recess, and further, the inside of the recess 14 is filled with a resin which contains the phosphor 3. The recess 14 is a part of the package 17. That is, the package 17 is constituted with the recess 14 and the supporting body 16 connected to the recess 14. As shown in FIG. 28(b), the positive and negative lead electrodes 15 are interposed between the recess 14 and the supporting body 16 to form the mounting surface of the light emitting element 2 in the recess 14. Further, the lead electrodes 15 are exposed on the outer surface side of the package 17 and bent to be along the outer shape thereof. The light emitting element 2 is mounted on and electrically connected to the lead electrodes 15 in the recess 14 and is capable of emit light with a supply of electric power from outside through the lead electrodes 15. FIG. 28(a) shows a typical arrangement of light emitting device 60 being mounted with the bottom surface which is wider and perpendicular to the mounting surface of the light emitting element 2. With the above-described structure, a light emitting device 60 capable of emitting light in the direction approximately in parallel to the mounting surface of the light emitting element, that is, emitting light from the side surface adjacent to the mounting surface of the light emitting device can be obtained.

The light emitting device 60 will be described in detail below. The package 17 is integrally molded so that an end portions of the positive and negative lead electrodes 15 are inserted in the package 17. That is, the package 17 has a recess 14, which is capable of housing the light emitting element 2, at its principal surface side, and the bottom surface of the recess 14 is provided with an end part of the positive lead electrode 15 and an end part of the negative lead electrode 15 each of which is separated from each other and the respective principal surfaces are exposed. An insulating molding member is filled between the positive and negative lead electrodes 15. In the present invention, the shape of the light emitting surface formed at the principal surface side of the light emitting device is not limited to a rectangular shape as shown in FIG. 28 and an oval shape can be employed. Employing various shapes allows widening the light emitting surface as large as possible while maintaining the mechanical strength of the side wall portion of the package defining the recess 14, so that it is possible to obtain a light emitting device capable of illuminating wide range even with a thin body.

Also, in the light emitting device 60 of Embodiment 2, the positive and negative lead electrodes 15 are inserted so that another end portions thereof protrude from a side surface of the package. The protruded portions of the lead electrodes 15 are bent either toward the back side which is opposite from the principal surface of the package or toward the mounting surface side which is perpendicular to the principal surface. The shape of the inner wall defining the recess 14 is not specifically limited, but in a case where the light emitting element 4 is mounted, a taper shape with the inner diameter thereof gradually increasing toward the opening. With this arrangement, light emitted from the end surface of the light emitting element 2 can be extracted effectively in the emission observing surface direction. Also, it is preferable that the recess has a light reflecting function by applying a metal plating such as silver or the like to the inner wall surface of the recess.

In the light emitting device 60 of Embodiment 2, a light emitting element 4 is mounted in the recess 14 of the package 1 formed as described above, and the encapsulating member 18 is disposed by filling a translucent resin to cover the light emitting element in the recess. Phosphor 3 which is a wavelength converting member is contained in the translucent resin. A silicone resin composition is preferably used for the translucent resin, but an insulating resin composition having translucency, such as an epoxy resin composition and an acrylic resin composition can also be used.

(Light Emitting Element)

The light emitting elements can emit light from ultraviolet region to visible light region. Particularly, it is preferable to use a light emitting element which has an emission peak wavelength of 240 nm to 480 nm, more preferably, of 445 nm to 455 nm and has a light emitting layer capable of emitting light having wavelength which can effectively excite a fluorescent material. This is because using an excitation light source of the region described above allows provision of a phosphor having high light emitting efficiency. Also, using a semiconductor light emitting element as the excitation light source allows obtaining a stable light emitting device having high efficiency and high output linearity with respect to input, and having high resistance against mechanical shock. Visible light of shorter wavelength range is mainly in the blue light region. In the present specification, "region from near-ultraviolet to short wavelength side of visible light" refers to a region between about 240 nm and about 500 nm. Hereinafter, a nitride semiconductor light emitting element will be described as an example of a light emitting element, but the invention is not limited thereto.

Specifically, it is preferable that the light emitting element is a nitride semiconductor element containing In or Ga. Because, the chlorosilicate phosphor according to Example 1 strongly emits strongly at around 495 nm to 548 nm, so that a light emitting element of this wavelength range has been required. This light emitting element emits light having its emission peak wavelength in a region from near-ultraviolet to short-wavelength region of visible light. At least one kind of phosphor is excited by the light from the light emitting element and exhibits a predetermined color of light. Further, the width of the emission spectrum of the light emitting element can be reduced, so that the chlorosilicate phosphor can be excited efficiently and also an emission spectrum which would not significantly affect the conversion of the color can be emitted (discharged) from the light emitting device.

In the light emitting element 2 according to Embodiment 2, an LED chip which is an example of nitride semiconductor element is employed. In addition, a known light emitting element can be appropriately used as the light emitting element 2, but for a light emitting device provided with a fluorescent material, a semiconductor light emitting element capable of emitting light which can excite the phosphor is preferable. Various semiconductors such as ZnSe and GaN can be exemplified as such semiconductor light emitting elements, but a nitride semiconductor ($In_xAl_yGa_{1-X-Y}N$; $0 \leqq X$; $0 \leqq Y$; and $X+Y \leqq 1$) capable of emitting light of a short wavelength which can effectively excite the phosphor is preferably exemplified. Various emission wavelengths can be selected depending on the materials or the degree of the mixed crystal in the semiconductor layers. In the light emitting element 2 used in the present embodiment, the positive and negative electrodes are disposed on the same surface side, but the positive and negative electrodes may be disposed respectively on the corresponding surfaces. In addition, it is not necessary that each one of the positive and negative electrodes is disposed, and two or more of them may be disposed respectively.

As described above, using the light emitted from the light emitting element for the excitation light source, a light emitting device with less power consumption and higher efficiency as compared to conventional mercury lamps can be obtained. In addition, in the light emitting device according to Embodiment 2, the chlorosilicate phosphor described above can be used.

(Phosphor)

The phosphors described in Embodiment 1 are used for the phosphor 3 in Embodiment 2. The phosphor 3 is preferably contained in a resin at an approximately constant rate. With this, light without color irregularity can be obtained. The brightness, wavelength, or the like of the light emitted from the light emitting device is affected by the particle size of the phosphor 3 enclosed in the light emitting device 60, the homogeneity of the applied phosphor, the thickness of the resin in which the phosphor is contained, and the like. Specifically, if the amount and the size of the phosphor, which is excited by the light emitted from the light emitting element 2 until the light exits from the light emitting device 60, are unevenly distributed in the corresponding portion of the light emitting device 60, irregular color may occur. Emission is considered to occur mainly at the surface of the particle. Therefore, generally, the surface area per unit weight of the powder can be secured with a small average particle size, and decrease in the brightness can be avoided. Further, the small particle phosphor diffusely reflect light so that it is possible to avoid the occurrence of irregular color in emitting light. On the other hand, a large particle size phosphor improves the light conversion efficiency. Therefore, effective extraction of light can be realized by controlling the amount and the particle size of the phosphor.

Further, the phosphor disposed in the light emitting device 60 is more preferably has resistance to heat generated from the light source and weather resistance independent of the environment of usage. This is because generally, the fluorescence intensity decreases as the temperature of the medium rises. Because this results in increase in the intermolecular collision and a loss of potential energy due to deactivation through radiationless transition with the rise of the temperature.

The phosphor 3 can be disposed to be unevenly distributed to a part in the resin. For example, disposing the phosphor close to the light emitting element 2 enables efficient wavelength conversion of light from the light emitting element 2 and the light emitting device of excellent luminous efficiency can be obtained.

Also, two or more kinds of phosphors can be contained in an encapsulating member 18. With this, the wavelength of the main light source which is outputted from the light emitting layer is converted by the first phosphor and the light whose wavelength is further converted by the second phosphor can be obtained. Adjusting the combination of a plurality of phosphors enables expressing various colors with combining the main light source, the light whose wavelength is converted by the first phosphor, the light whose wavelength is further converted by the second phosphor, and the light whose wavelength is directly converted from the main light source by the second phosphor.

According to the light emitting device 60 of Embodiment 2, blue light from a LED, a phosphor according to Embodiment 1 which can be excited by the blue light to emit green light, and further, a phosphor capable of emitting red light are used in combination, so that a white light having excellent light emitting characteristics can be emitted. Examples of the phosphor capable of emitting red light described above include $(Ca_{1-x}Sr_x)AlB_ySiN_{3+y}$:Eu ($0 \leq x \leq 1.0$; $0 \leq y \leq 0.5$) or $(Ca_{1-z}Sr_z)_2Si_5N_8$:Eu ($0 \leq z \leq 1.0$). Using these phosphors in combination, the half maximum full-width of each component light corresponding to the three primary colors can be reduced, that is, a white light made up of sharp three wavelengths can be obtained. Accordingly, overlapping of respective wavelengths can be reduced and the emission peak of each component light and the transmissivity peak of the color filter can be approximately conformed. Therefore, a white light including the component lights in the effective wavelength range with high efficiency can be realized. As a result, a loss in the amount of luminous flux after passing the filter can be reduced, and emission with improved overall output can be obtained. The above described phosphors have excellent stability in high temperature and humidity so that a light emitting device of good weather resistance can be obtained.

Also, as an example of the phosphor, in the cases where the light from the light emitting element is a visible light of short wavelength with high energy, a perylene derivative which is an organic fluorescent material, inorganic fluorescent materials such as ZnCdS:Cu, YAG:Ce, nitrogen containing CaO—$Al_2O_3$—$SiO_2$ activated with Eu and/or Cr, or the like, can be appropriately used. Similarly, other than YAG:Ce, CaO—$Al_2O_3$—$SiO_2$ activated with Eu and/or Cr, any known fluorescent materials such as described in JP2005-19646A or JP2005-8844A can also be used. Also, a sulfide phosphor of alkali earth-based, thiogallate-based, thiosilicate-based, zinc sulfide-based or oxysulfide-based can also be appropriately selected. Examples of alkali earth-based phosphors include MS:Re (M is one or more elements selected from Mg, Ca, Sr, and Ba, Re is one or more elements selected from Eu and Ce), thiogallate based phosphors include $MN_2S_4$:Re (M is one or more elements selected from Mg, Ca, Sr, and Ba, N is one or more elements selected from Al, Ga, In, and Y, Re is one or more elements selected from Eu and Ce), thiosilicate-based phosphors include $M_2LS_4$:Re (M is one or more elements selected from Mg, Ca, Ba, Sr, and Ba, L is one or more elements selected from Si, Ge, and Sn, Re is one or more elements selected from Eu and Ce), zinc sulfide-based phosphors include ZnS:K (K is one or more elements selected from Ag, Cu, and Al), and oxysulfide-based phosphors include $Ln_2O_2S$:Re (Ln is one or more elements selected from Y, La, and Gd, Re is one or more elements selected from Eu and Ce).

Also, an additive member can be appropriately contained in the encapsulating member 18. For example, containing a light diffusing material allows lowering directivity from the light emitting element, so that view angle can be increased.

Embodiment 3

Further, as a light emitting device according to Embodiment 3 of the present invention, a surface-mounted type light emitting device 70 is shown in FIG. 29. FIG. 29 (a) shows a plan view and FIG. 29 (b) shows a cross-sectional view of the light emitting device 70 respectively. A nitride semiconductor light emitting element capable of exciting phosphor with emitted ultraviolet light can be employed as the light emitting element 71. Alternatively, a nitride semiconductor light emitting element capable of exciting phosphor with emitted blue light can also be employed as the light emitting element 71. In this embodiment, a light emitting element 71 capable of exciting phosphor with emitted ultraviolet light will be exemplified. For the light emitting element 71, a nitride semiconductor light emitting element having InGaN semiconductor with emission peak wavelength at about 370 nm as the light emitting layer is used. In the light emitting element 71, a p-type semiconductor layer and an n-type semiconductor layer (not shown) are formed, and conductive wires 74 connected to the lead electrodes 72 are disposed on the p-type semiconductor layer and the n-type semiconductor layer. The insulating sealing material 73 is disposed to cover the periphery of the lead electrodes 72 in order to prevent short circuit. A translucent window portion 77 extended from a kovar lid 76 located over the package 75 is disposed above the light emitting element 71. A uniform mixture of the phosphor 3 and the coating member 79 is applied on approximately entire inner surface of the translucent window portion 77.

Next, each electrode of the die-bonded light emitting element 71 and each lead electrode 72 exposed at the bottom surface of the recess of the package are respectively electrically connected by the conductive wire such as Ag wire. After the moisture in the recess of the package is sufficiently removed, it is sealed by a kovar lid 76 having a window portion 77 in its center portion, then seam welded. A color converting member is disposed in advance on the glass window portion, such that a chlorosilicate phosphor 3 which is a wavelength converting member is included in the slurry made by 90 wt % of nitro cellulose and 10 wt % of γ-alumina, then it is applied on the back surface of the translucent window portion 77 of the lid 76, and hardened by heat at 220° C. for 30 minutes. Light outputted from the light emitting element 71 of the light emitting device 70 formed as described above excites the phosphor 3, so that a light emitting device capable of emitting light of a desired color with high luminance can be obtained. With this, a light emitting device in which adjustment of color tone is facilitated and has excellent mass productivity and reliability can be obtained.

In Embodiment 3, light in ultraviolet region used as the excitation light source is of low luminosity factor, so that the emission light color of the light emitting device is determined by the emission light color of the fluorescent material that is actually used. For example, employing the phosphor described in Embodiment 1 in the light emitting element of Embodiment 3, and further employing a phosphor capable of emitting light in blue and red, a light emitting device capable of emitting white light with high luminosity can be obtained. With the light emitting device of Embodiment 3, color shift of the fluorescent material which emits light in visible light range can be controlled within a very small level even in a case in which color shift of the light emitting element occurs due to changes in applied current or the like. As a result, a light emitting device with small change in color tone can be provided. Ultraviolet range generally refers to a range shorter than 380 nm or 400 nm, and light of 420 nm or shorter is almost invisible in terms of luminosity. Therefore, it does not have a large effect on color tone.

Embodiment 4

FIG. 30(a) shows a perspective view of the light emitting device 40 according to Embodiment 4. FIG. 30(b) is a cross sectional view of the semiconductor light emitting device 40 taken along line XXXB-XXXB' shown in FIG. 30(a). The light emitting device 40 of Embodiment 4 will be generally described below based on FIGS. 30(a) and 30(b). The light emitting device 40 has the package 12 defining a space opening upwardly in an approximately recessed shape, mounted on the lead frames 4. Further, a plurality of light emitting elements 2 are mounted on the lead frames which are within the space in the package 12 and exposed. That is, the package 12 serves as a casing body surrounding the light emitting elements 2. Also mounted in the opening in the package 12 is a protective element 13 such as Zener diode which becomes conductive when a voltage exceeding a specified voltage is applied. Further, the light emitting elements 2 are electrically connected to the led frames 4 via the bonding wires 5 or the bumps. Additionally, the opening space of the package 12 is filled with the encapsulating resin 6.

The phosphor 3 contained in the package 12 is shown in FIG. 30(b) (the phosphor 3 is omitted in FIG. 30(a)). The above-described chlorosilicate phosphor can be used as the phosphor 3, and the state of containing the phosphor in the resin 6 is similar to that in Embodiment 2.

Embodiment 5

FIG. 31 shows the light emitting device 1 having a shell shape according to Embodiment 5. The light emitting device 1 has the light emitting element 2 mounted on the lead frame 4 in a cup 10 having a recess shape formed in the lead frame 4 made of an electrically conductive member, and the phosphor 3 which convert the wavelength of at least a part of light emitted from the light emitting element 2. The phosphor of Embodiment 1 can be employed as the phosphor 3, as in the case in Embodiment 2. Also, a light emitting element having an emission peak wavelength in a range of about 360 nm to about 480 nm is used as the light emitting element 2. The positive and negative electrodes 9 disposed on the light emitting element 2 are electrically connected to the lead frames 4 via the electrically conductive bonding wires. Further, the light emitting element 2, the lead frames 4, and the bonding wires 5 are covered with the shell shaped mold 11 so that the lead frame electrodes 4a which are a part of the lead frames 4 protrude. The translucent resin 6 is filled in the mold 11 and further, the phosphor 3 which is a wavelength converting member is contained in the resin 6. It is preferable to use a silicone resin composition such as a silicone-based resin having a siloxane bond in its molecule, a fluorine resin having a siloxane skeleton as the resin 6. With this arrangement, the encapsulating resin excellent in light resistance and heat resistance can be obtained. On the other hand, a silicone resin generally has high permeability to gases due to a long bond distance between the elements, so that the moisture in the environment can easily permeate through. Therefore, under high temperature and high humidity, dissolution of the components of the phosphor tends to be increased. However, dissolution of chlorine from the phosphor is suppressed in the phosphor of the present invention, so that even in a combination with a silicone resin composition, the chlorine component permeating the silicone-based resin can be significantly reduced. That is, it is preferable that combining the phosphor of the present invention with a silicone-based resin allows taking advantage of the silicone-based resin while avoiding the effects of chlorine on the members. Also, as the resin 6, an insulating resin composition having translucency such as an epoxy resin composition and an acrylic resin composition can also be used. By providing electric power from an external power source to the lead frame electrode 4a protruding from the resin 6, light is emitted from the light emitting layer 8 contained in the layers of the light emitting element 2. The emission peak wavelength outputted from the light emitting layer 8 has an emission spectrum in a region from ultraviolet to blue light with about 500 nm or shorter. A part of the emitted light excites the phosphor 3 and light having different wavelength than the wavelength of the main light source from the light emitting layer 8 can be obtained.

Embodiment 6

Next, the light emitting device 20 according to Embodiment 6 will be shown in FIG. 32(a). The same members in the light emitting device 1 of Embodiment 5 will be assigned with the same reference numerals, and their description will be omitted. In the light emitting device 20, the resin 6 containing the above-described phosphor 3 is filled only in the recess-shaped cup 10 formed with the lead frame 4. The phosphor 3 is not contained in the resin 6 which is filled in the mold 11 outside of the cup 10. The resin containing the phosphor 3 and the resin that does not contain the phosphor 3 are preferably of the same kind, but they may be of different kinds. If different kinds of resins are used, utilizing the difference in temperature necessary for curing each resin, the softness can be changed.

In the light emitting device 20, the light emitting element 2 is mounted at approximately center of the bottom surface defining the opening in the cup 10, so that the light emitting element 2 is enclosed in the resin 6 containing the phosphor 3. Light from the light emitting element needed to pass the phosphor-containing resin uniformly so that the wavelength of light from the light emitting layer 8 can be converted by the phosphor without deviation. That is, the thickness of the film containing the phosphor through which light from the light emitting layer 8 passes through needed to be uniform. Therefore, the size of the cup 10 and the mounting position of the light emitting element 2 are determined so that the distances from the periphery of the light emitting element 2 to the wall surface and top of the cup 10 are uniform. With the light emitting device 20, the film thickness of the resin 6 which contains the phosphor 3 can be easily adjusted uniformly.

Also, as in the Embodiment 2, the phosphor 3 can be included in the resin so as to be unevenly distributed in the resin. For example, the light emitting device 50 shown in FIG. 32(b) has a phosphor layer having an approximately uniform thickness disposed near the periphery of the light emitting element 2. With this arrangement, the amount of the phosphor through which light emitted from the light emitting element 2 passes can be approximately uniform, that is, approximately the same amount of phosphor is wavelength converted, so that a light emitting device with reduced color shifting can be obtained. The kind of phosphor 3 employed can be the same as in Embodiment 2.

Embodiment 7

Moreover, as a light emitting device according to Embodiment 7 of the present invention, the light emitting device 30 of a cap-type is shown in FIG. 33. For the light emitting element 2, a light emitting element having an emission peak wavelength at about 400 nm is employed. The light emitting device 30 is made by covering the surface of the mold 11 of the light emitting device 20 of Embodiment 2 with a cap 31 made of a translucent resin dispersed with the phosphor 3.

In the cap 31, the phosphor 3a is uniformly dispersed in the translucent resin 6a. The resin 6a containing the phosphor 3a is formed in a shape to engage with the outer shape of the mild 11 of the light emitting device 30. Alternatively, it is possible to employ a manufacturing method in which after applying the translucent resin 6a containing a phosphor into a designated mold, push the light emitting device 30 into the designated mold to mold. Examples of specific materials for the resin 6a of the cap 31 include a transparent resin excellent in temperature characteristics and weather resistance such as an epoxy resin, a urea resin, a silicone resin, and the like, and silica gel, glass, and an inorganic binder or the like. Other than those described above, a thermosetting resin such as a melamine resin, a phenol resin, and the like, can be used. Also useable are a thermoplastic resin such as polyethylene, polypropylene, polyvinyl chloride, and polystyrene, and a thermoplastic rubber such as stylene-butadiene copolymer, segmented polyurethane. In addition, a diffusing agent, barium titanate, titanium oxide, aluminum oxide, or the like, may be contained with the phosphor. A light stabilizer and/or a coloring agent may also be contained. For the phosphor 3 used in the cap 31, not only one kind, but also a mixture or stacked layers of plurality of phosphors can also be used.

In the light emitting device 30, the phosphor 3a may be contained only in the resin 6a in the cap 31, and additionally, the rain 6 containing the phosphor 3 may also be filled in the cap 10. The phosphors 3 and 3a may either be of the same kind or of different kinds. Also, a plural kinds of phosphors may be contained in each of the resins 6 and 6a. Accordingly, various colors of emitting light can be realized. A light emitting device capable of emitting white light will be described as an example. Light emitted from the light emitting element 2 excites the phosphor 3 which emits light in a range from blue-green to green, or from yellow to red. A part of light emitted from the phosphor 3 excites the phosphor 3a in the cap 31 which emits light in a range from green to yellow. Light from the phosphors are mixed and a white light is emitted from the surface of the cap 31 to outside. Various phosphors are used in a similar manner as in Embodiment 2.

Examples 49 to 51

Examples 49 to 51 will be shown below by way of examples of the light emitting devices of Embodiments 2 to 7. The light emitting device of Example 49 is a side-view type light emitting device according to Embodiment 2, having the phosphor according to Embodiment 1. Specifically, the light source of the light emitting device is an LED chip having emission spectrum at 457 nm to 460 nm, and a chlorosilicate shown by $Ca_{7.65}Eu_{0.5}MgSi_{4.3}O_{15.91}Cl_{1.84}$ (the amount of oxygen was determined by the valence of each element) and $CaAlSiN_3$:Eu were used as the phosphor. It is preferable the phosphor contains boron in view of the performance, and $CaAlB_{0.005}SiN_{3.005}$:Eu and the like can be used. The light emitting characteristics of the light emitting device of Example 49 will be shown in Table 19, and the emission spectrum thereof will be shown in FIG. 34, respectively.

TABLE 19

| | Applied current | Voltage | Luminance lv | Luminous flux Øv | Color coordinates | | Color temperature | |
|---|---|---|---|---|---|---|---|---|
| | cur [mA] | Vol [V] | [mcd] | [min] | x | y | Tcp [K] | Ra |
| Example 49 | 20 | 3.20 | 1273 | 3307 | 0.280 | 0.305 | 9079 | 88.1 |

As shown in FIG. 34, with the light emitting device of Example 49, the three primary colors of light respectively having a peak wavelength at about 457 to 460 nm, 525 nm, and 650 nm was confirmed. The light emitting device of Example 50 is a surface-emitting type light emitting device according to Embodiment 4, which uses the phosphor according to Embodiment 1. Specifically, the light source of the light emitting device is an LED chip having emission spectrum at 457 nm to 460 nm, and a chlorosilicate shown by $Ca_{7.65}Eu_{0.5}MgSi_{4.3}O_{15.91}Cl_{1.84}$ (the amount of oxygen is determined by the valence of each element) and $CaAlSiN_3$:Eu were used as the phosphor. It is preferable that the phosphor contains boron in view of the performance, and $CaAlB_{0.005}SiN_{3.005}$:Eu and the like can be used. The light emitting characteristics of the light emitting device of Example 50 will be shown in Table 20, and the emission spectrum thereof will be shown in FIG. 35, respectively.

TABLE 20

|  | Applied current | Voltage | Luminous flux Øv | Color coordinates | | Color temperature | |
| --- | --- | --- | --- | --- | --- | --- | --- |
|  | cur[mA] | Vol [V] | [min] | x | y | Tcp [K] | Ra |
| Example 50 | 150 | 3.29 | 10292 | 0.275 | 0.287 | 10839 | 80.4 |

As shown in FIG. 35, with the light emitting device of Example 50, the three primary colors of light respectively having a peak wavelength at about 457 to 460 nm, 525 nm, and 665 nm was confirmed.

Further, the light emitting device formed as Example 51 was a side view type light emitting device according to Embodiment 2, in which the light source is an LED chip having emission spectrum at 457 nm to 460 nm and a chlorosilicate shown by $Ca_{7.65}Eu_{0.5}MgSi_{4.3}O_{15.91}Cl_{1.84}$ (the amount of oxygen is determined by the valence of each element) and a nitride phosphor shown by $(Ca_{0.5}Sr_{0.5})_2Si_5N_8$:Eu were used as the phosphor. The light emitting characteristics of the light emitting device of Example 43 will be shown in Table 21, and the emission spectrum thereof will be shown in FIG. 39, respectively.

TABLE 21

|  | Applied current cur | Voltage | Luminance | Luminous flux Øv | Color coordinates | | Color temperature Tcp | |
| --- | --- | --- | --- | --- | --- | --- | --- | --- |
|  | [mA] | Vol [V] | lv [mcd] | [min] | x | y | [K] | Ra |
| Example 51 | 20 | 3.18 | 1271 | 3171 | 0.284 | 0.255 | 14666 | 73.6 |

As shown in FIG. 39, with the light emitting device of Example 51, the three primary colors of light respectively having a peak wavelength at about 457 to 460 nm, 525 nm, and 650 nm was confirmed.

With each of the light emitting devices of Examples 49 to 51, obtained was white light which is the mixed color of emission of a blue LED and two emissions of green and red by the phosphors, as shown in Table 19 to Table 21, FIG. 34, FIG. 35, and FIG. 39. Ideal RGB components for a typical three wavelength light emitting device preferably have the B component emission peak at 445 to 455 nm, the G component emission peak at 525 to 540 nm, and the R component emission peak at 620 to 630 nm, and moreover, the higher each of the emission peaks, the more preferable. With each of the light emitting devices of Examples 49 to 51, each peak wavelength of the three primary colors is close to the ideal wavelength condition, i.e., a white light with good color rendering properties. Therefore, effective use as light source for various equipment is anticipated.

INDUSTRIAL APPLICABILITY

The phosphors, the light emitting devices using them, and the method for manufacturing the phosphors according to the present invention can be suitably applicable to vacuum fluorescent displays, displays, PDPs, CRTs, FLs, FEDs and projectors, particularly to white light source for lighting applications, LED displays, backlight light sources, signals, switches with light, various sensors and indicators, or the like, which are using blue light emitting diodes or ultraviolet emitting diodes as light source and having excellent light emitting characteristics.

BRIEF DESCRIPTION OF THE DRAWINGS

FIG. 28($a$) is a perspective view and FIG. 28($b$) is a cross-sectional view taken along line XXVIIIB-XXVIIIB' of FIG. 28($a$).

FIG. 29($a$) is a plan view and FIG. 29($b$) is a cross-sectional view.

FIG. 30($a$) is a plan view and FIG. 30($b$) is a cross-sectional view.

DENOTATION OF NUMERALS

Figure 1:
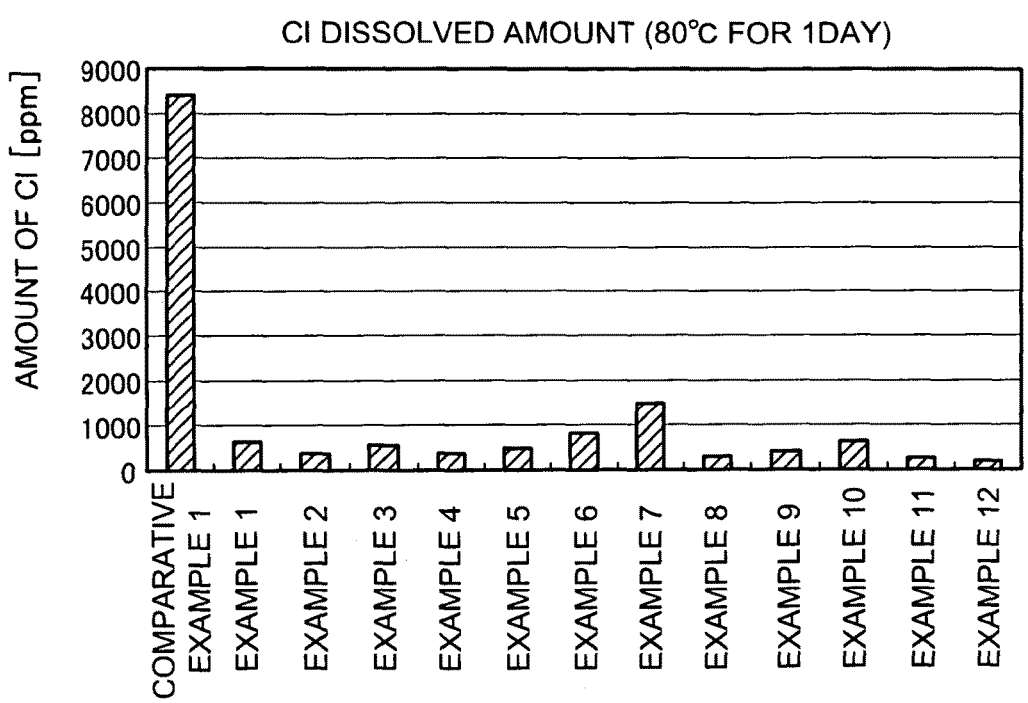
FIG. 1 is a graph of the amount of dissolved Cl in Comparative Example 1 and Examples 1 to 12.
Figure 2:
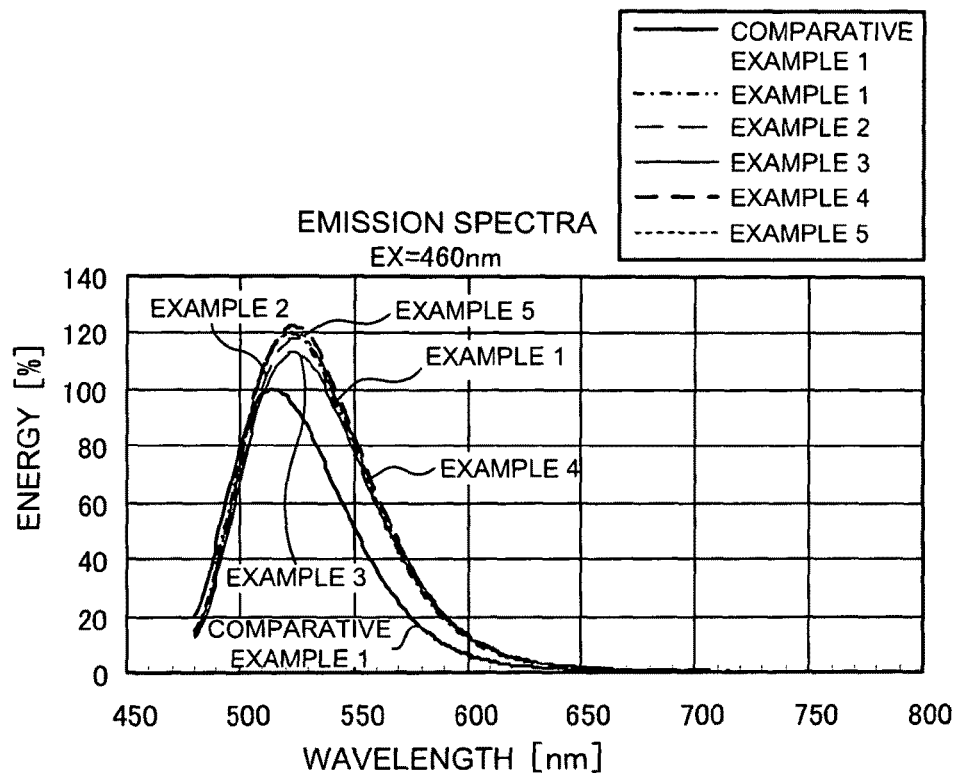
FIG. 2 shows the emission spectra of the phosphors according to Comparative Example 1 and Examples 1 to 5, excited by 460 nm.
Figure 3:
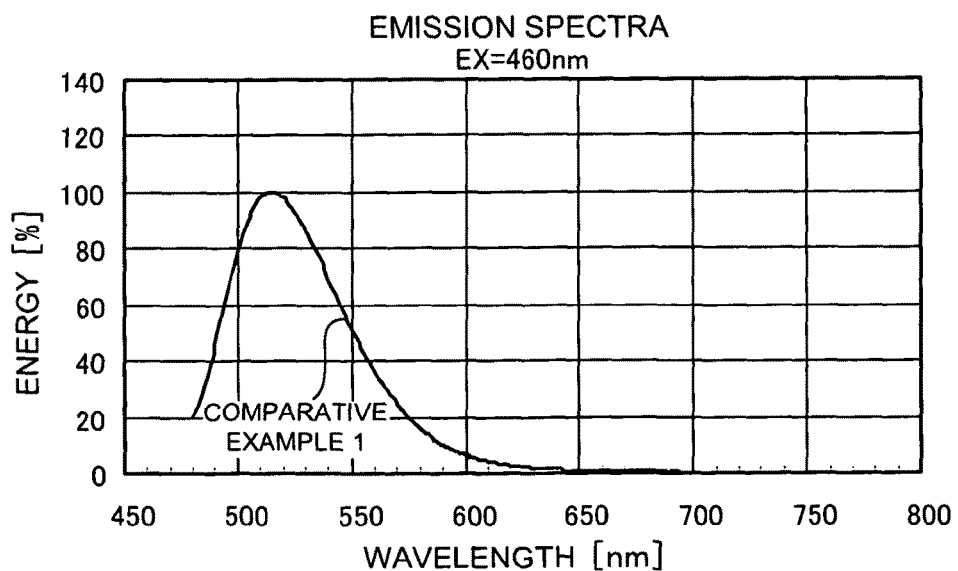
FIG. 3 shows the emission spectrum of the phosphor according to Comparative Example 1, excited by 460 nm.
Figure 4:
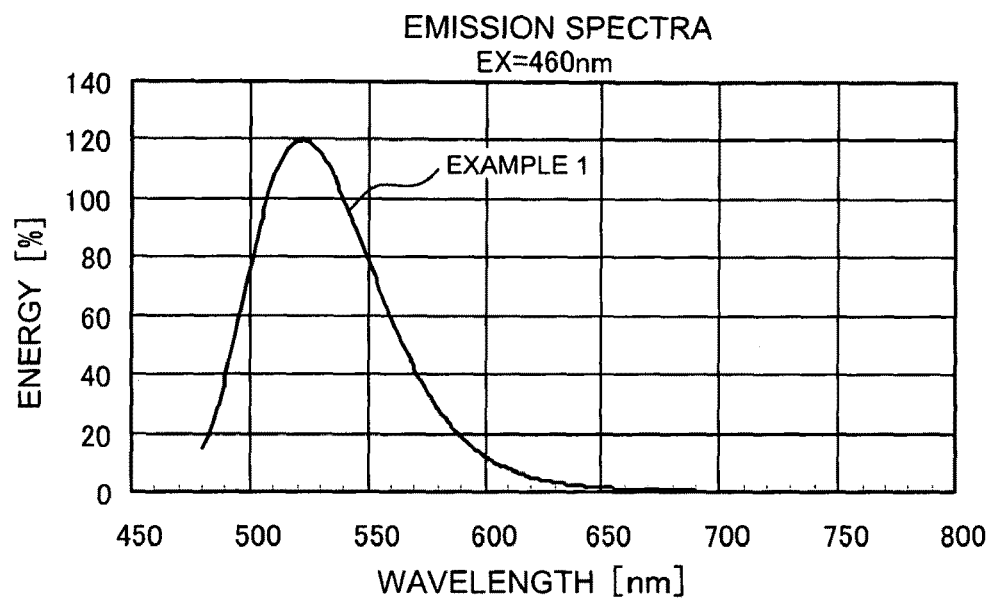
FIG. 4 shows the emission spectrum of the phosphor according to Example 1, excited by 460 nm.
Figure 5:
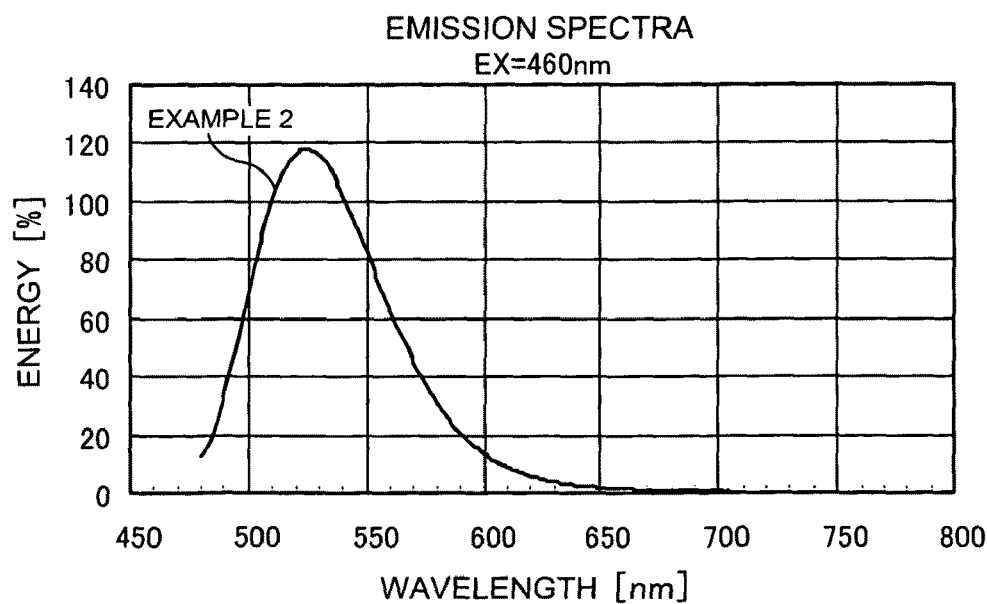
FIG. 5 shows the emission spectrum of the phosphor according to Example 2, excited by 460 nm.
Figure 6:
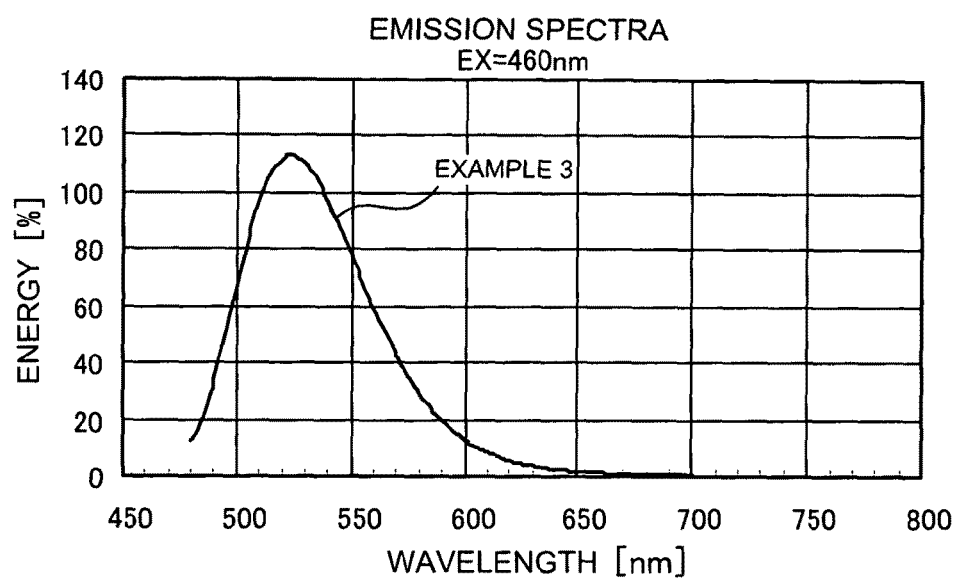
FIG. 6 shows the emission spectrum of the phosphor according to Example 3, excited by 460 nm.
Figure 7:
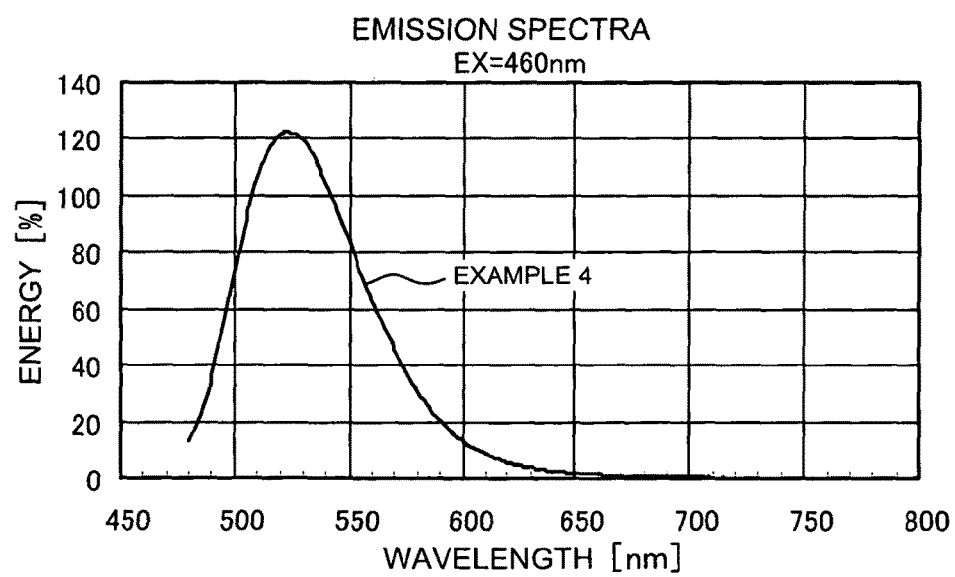
FIG. 7 shows the emission spectrum of the phosphor according to Example 4, excited by 460 nm.
Figure 8:
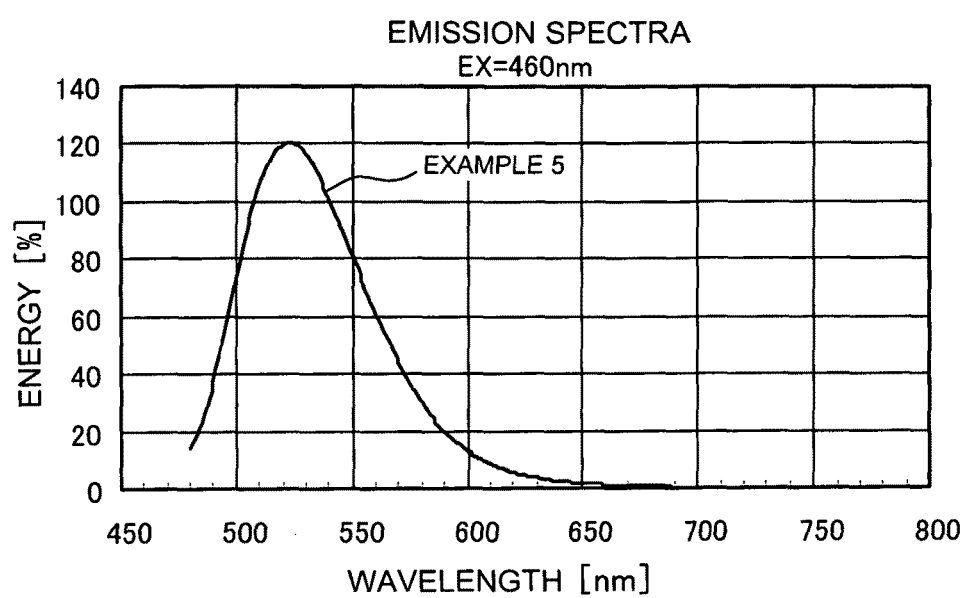
FIG. 8 shows the emission spectrum of the phosphor according to Example 5, excited by 460 nm.
Figure 9:
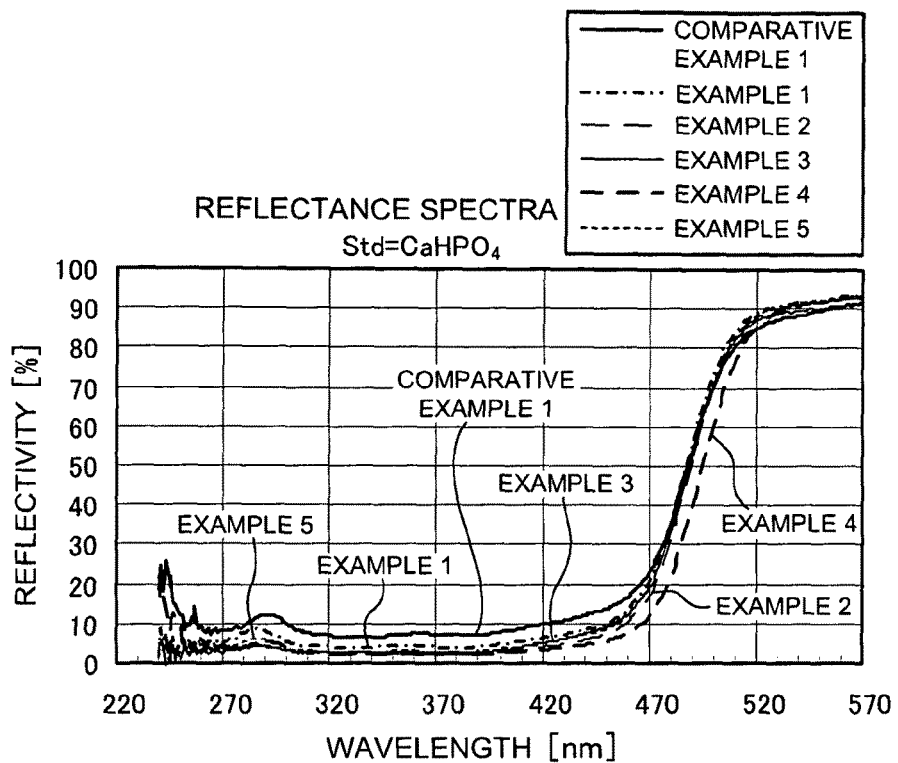
FIG. 9 shows the reflectance spectra of the phosphors according to Comparative Example 1 and Examples 1 to 5.
Figure 10:
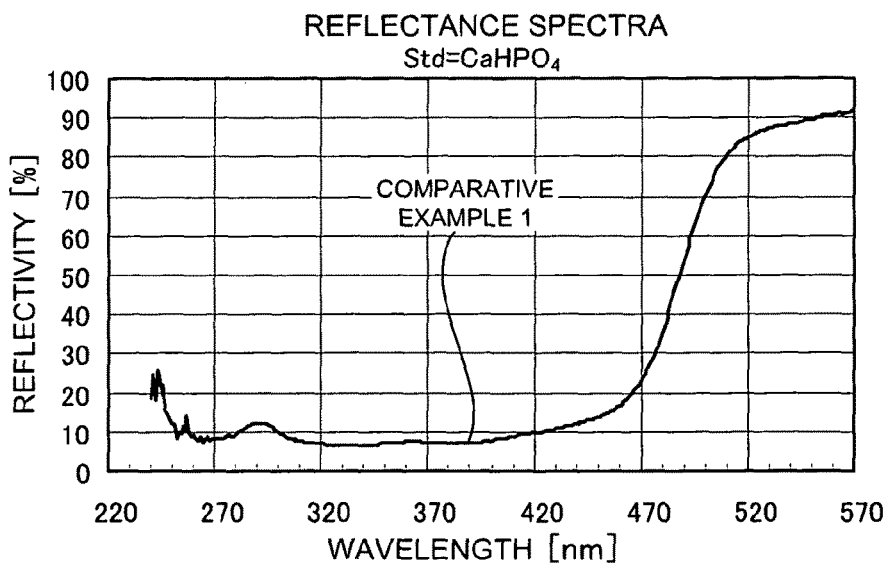
FIG. 10 shows the reflectance spectrum of the phosphor according to Comparative Example 1.
Figure 11:
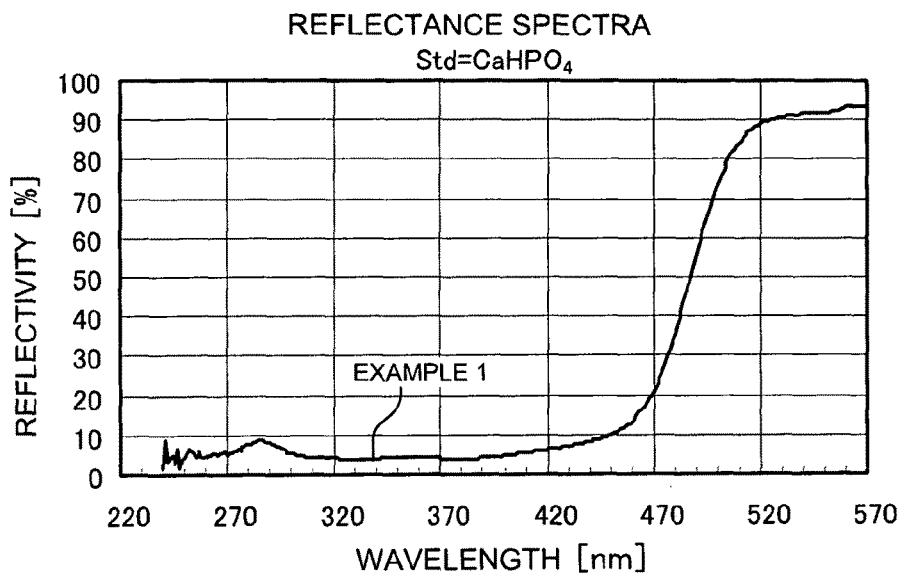
FIG. 11 shows a reflectance spectrum of a phosphor according to Example 1.
Figure 12:
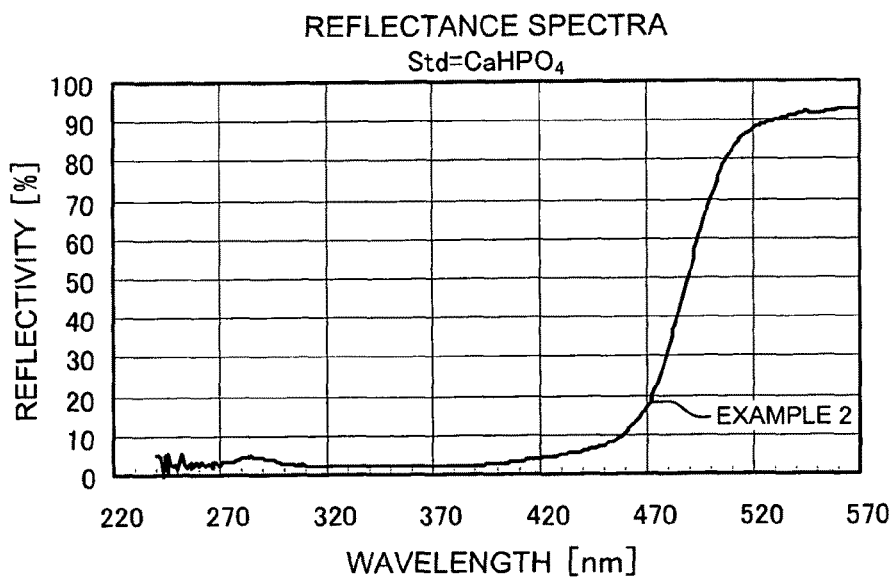
FIG. 12 shows a reflectance spectrum of a phosphor according to Example 2.
Figure 13:
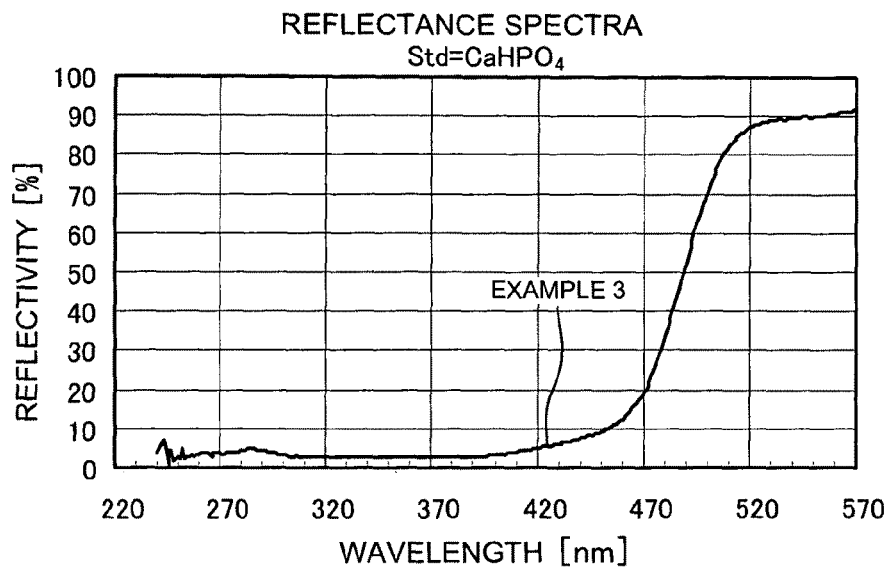
FIG. 13 shows a reflectance spectrum of a phosphor according to Example 3.
Figure 14:
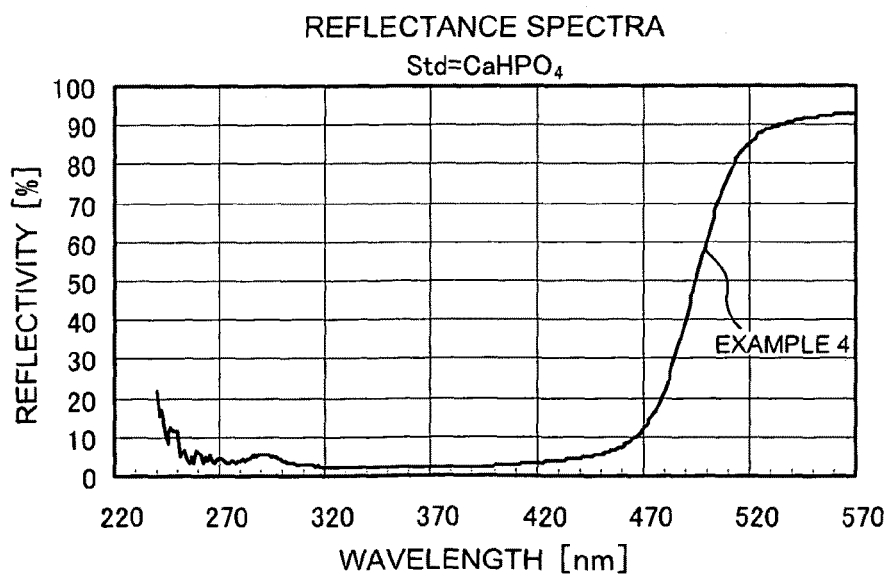
FIG. 14 shows a reflectance spectrum of a phosphor according to Example 4.
Figure 15:
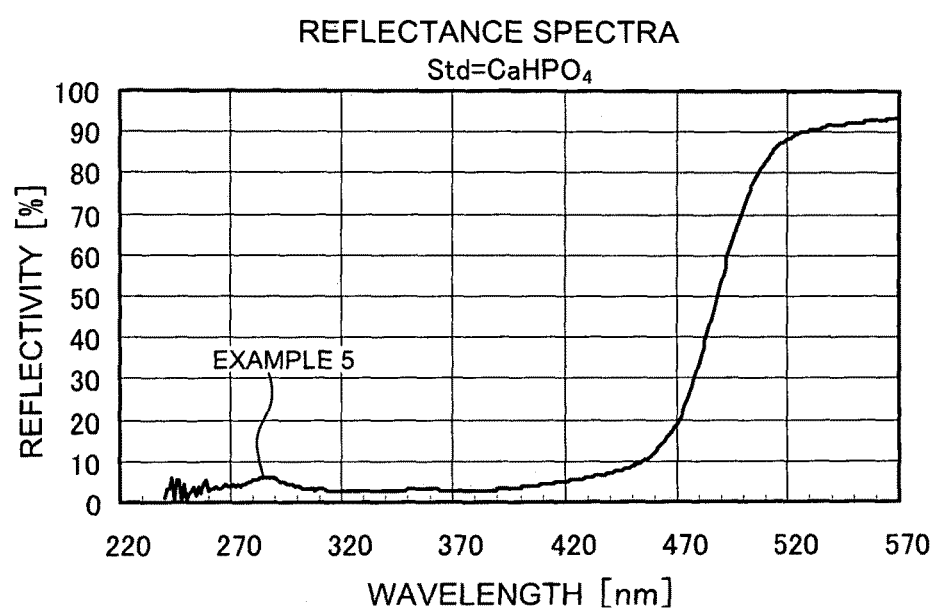
FIG. 15 shows a reflectance spectrum of a phosphor according to Example 5.
Figure 16:
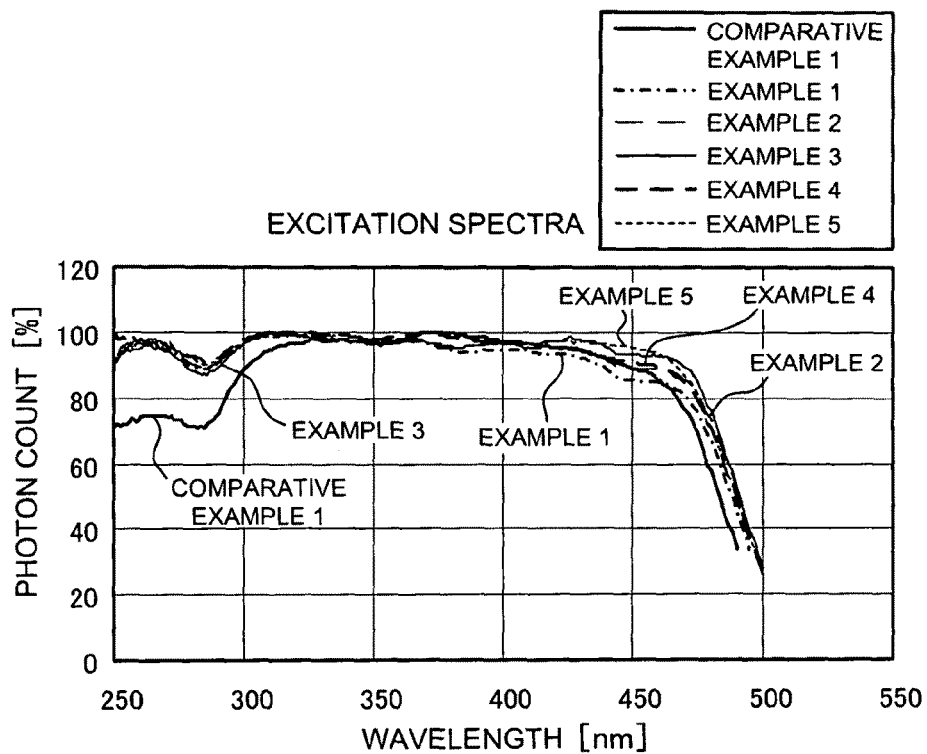
FIG. 16 shows excitation spectra of phosphors according to Comparative Example 1 and Examples 1 to 5.
Figure 17:
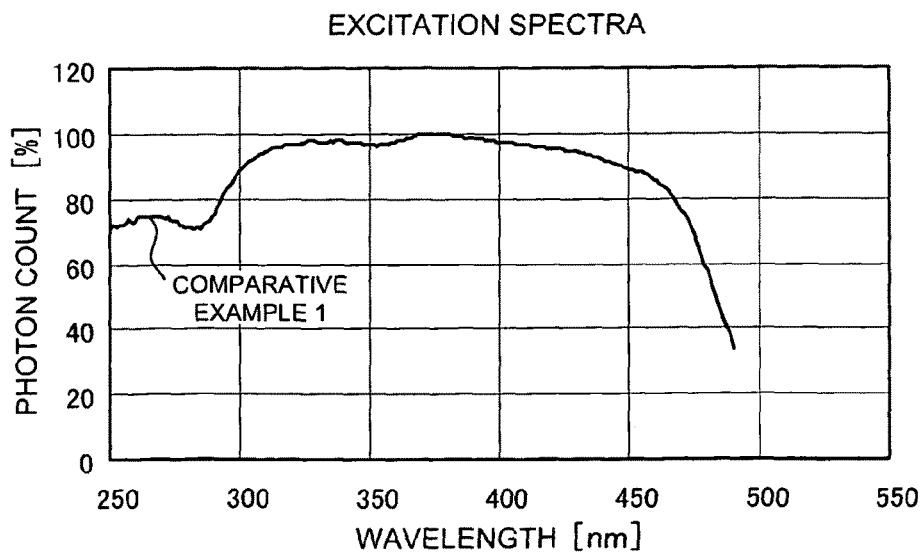
FIG. 17 shows an excitation spectrum of a phosphor according to Comparative Example 1.
Figure 18:
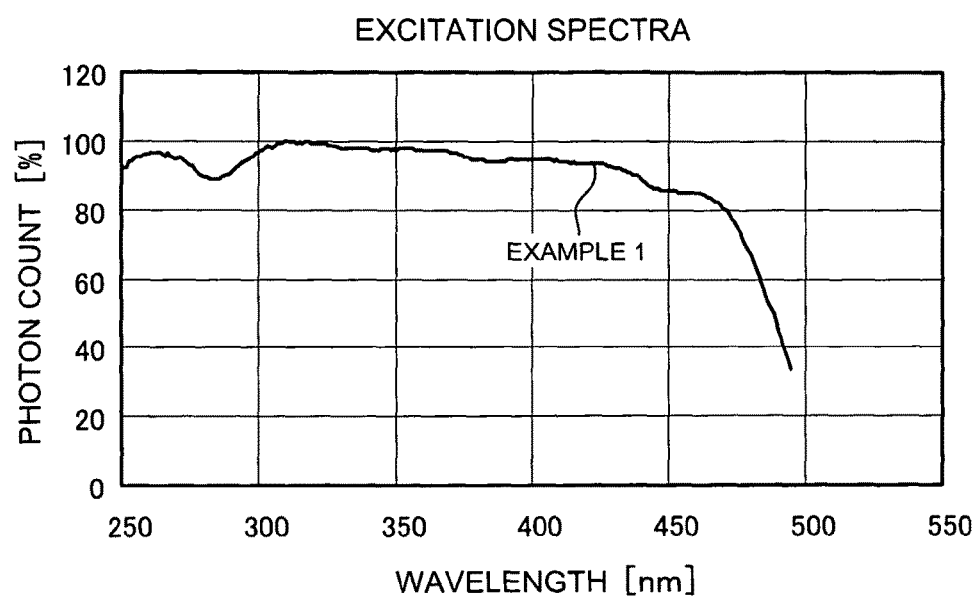
FIG. 18 shows an excitation spectrum of a phosphor according to Example 1.
Figure 19:
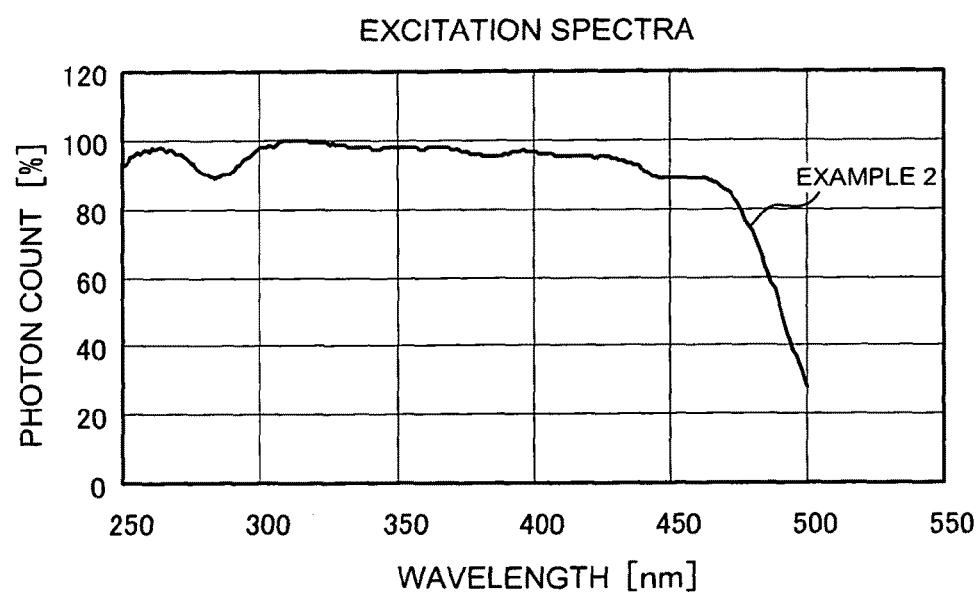
FIG. 19 shows an excitation spectrum of a phosphor according to Example 2.
Figure 20:
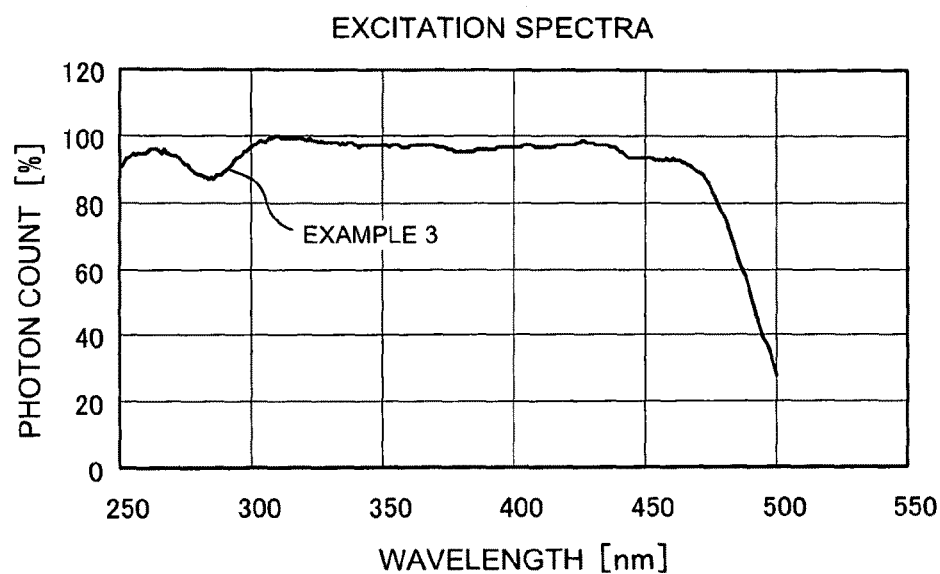
FIG. 20 shows an excitation spectrum of a phosphor according to Example 3.
Figure 21:
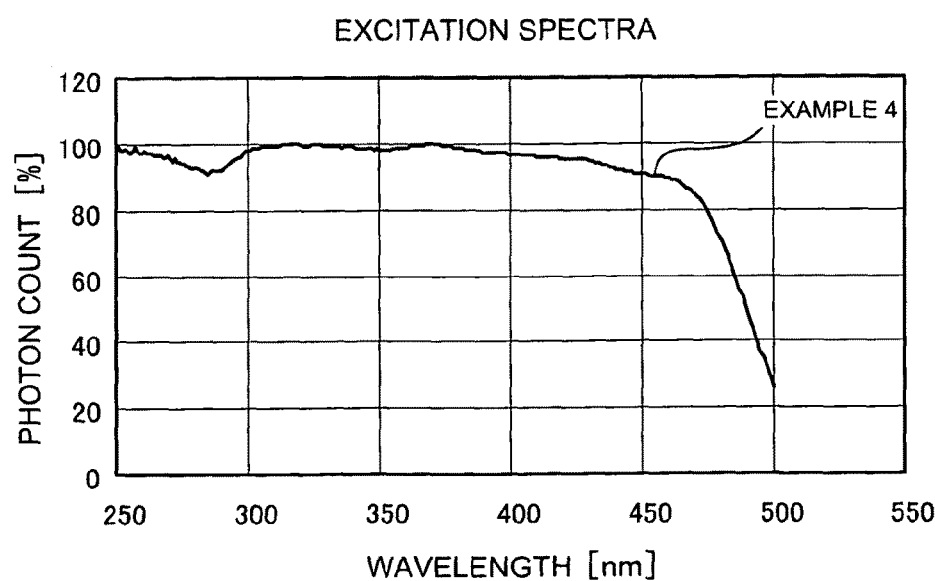
FIG. 21 shows an excitation spectrum of a phosphor according to Example 4.
Figure 22:
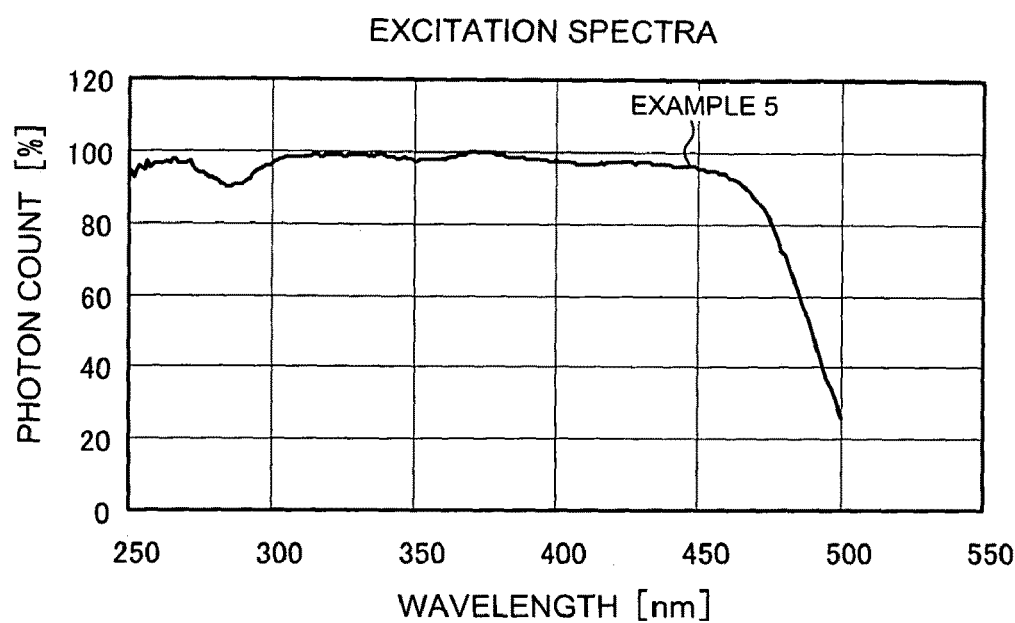
FIG. 22 shows an excitation spectrum of a phosphor according to Example 5.
Figure 23:
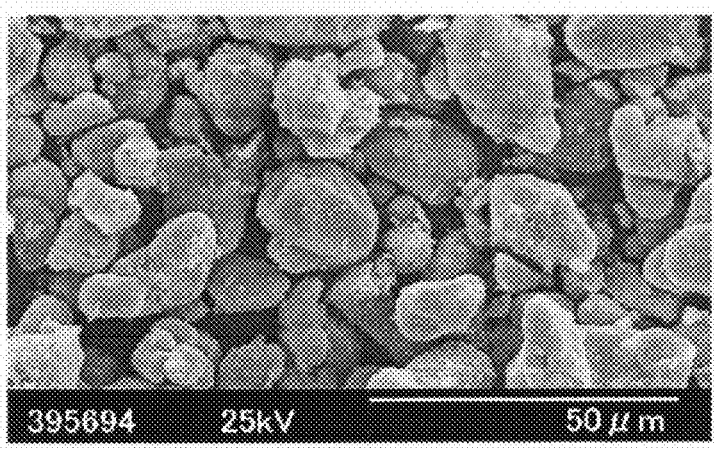
FIG. 23 shows a 1000-times magnified photograph of a phosphor according to Comparative Example 1.
Figure 24:
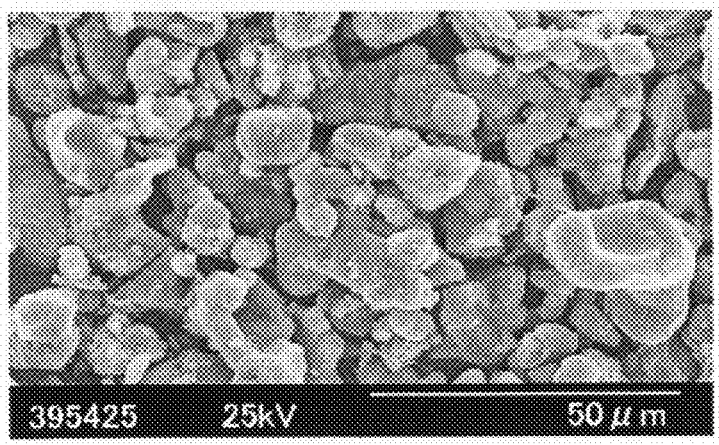
FIG. 24 shows a 1000-times magnified photograph of a phosphor according to Example 1.
Figure 25:
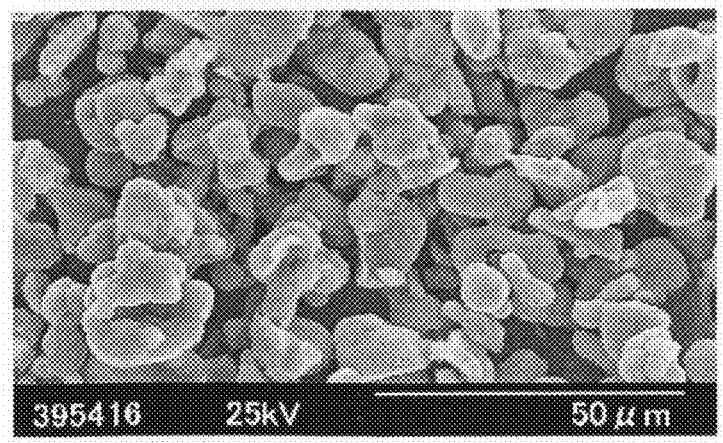
FIG. 25 shows a 1000-times magnified photograph of a phosphor according to Example 2.
Figure 26:
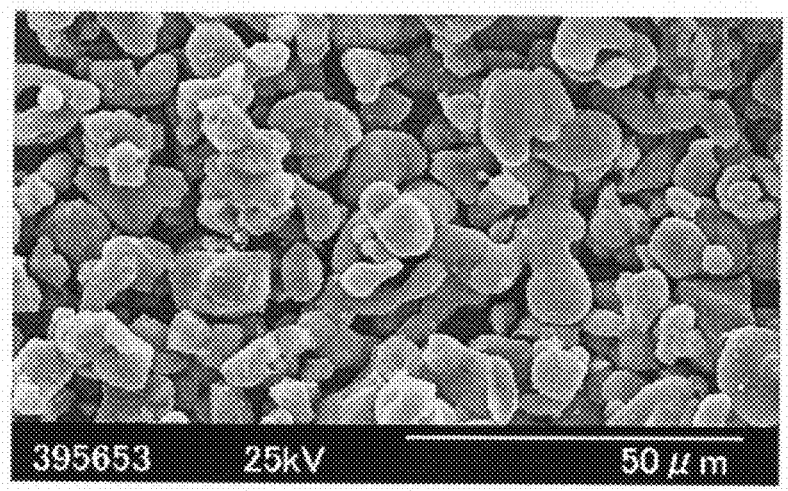
FIG. 26 shows a 1000-times magnified photograph of a phosphor according to Example 4.
Figure 27:
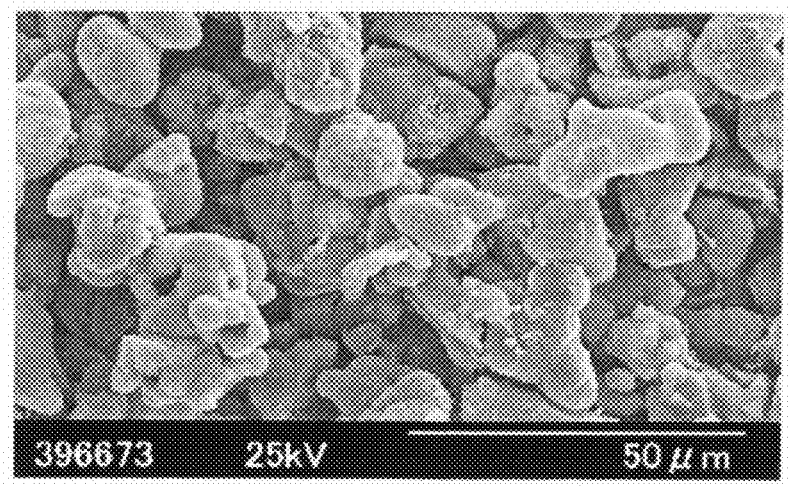
FIG. 27 shows a 1000-times magnified photograph of a phosphor according to Example 5.
Figure 28:
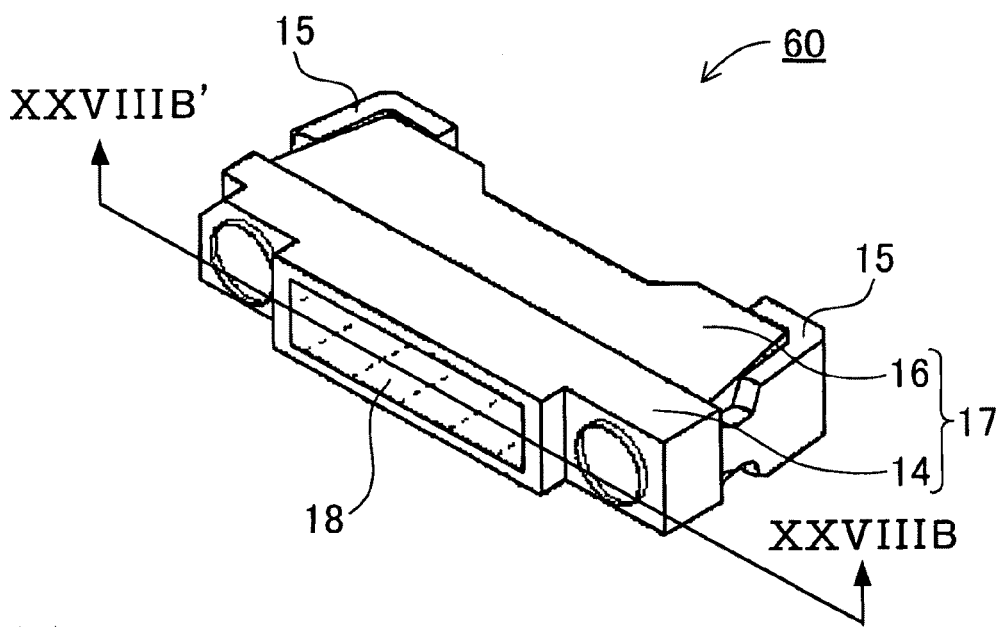
FIG. 28 shows a light emitting device according to Embodiment 2.
Figure 28:
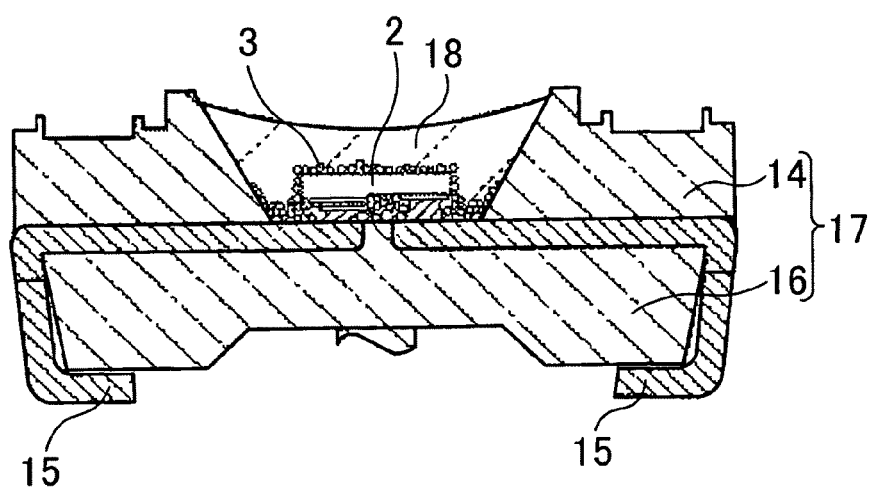
Figure 29:
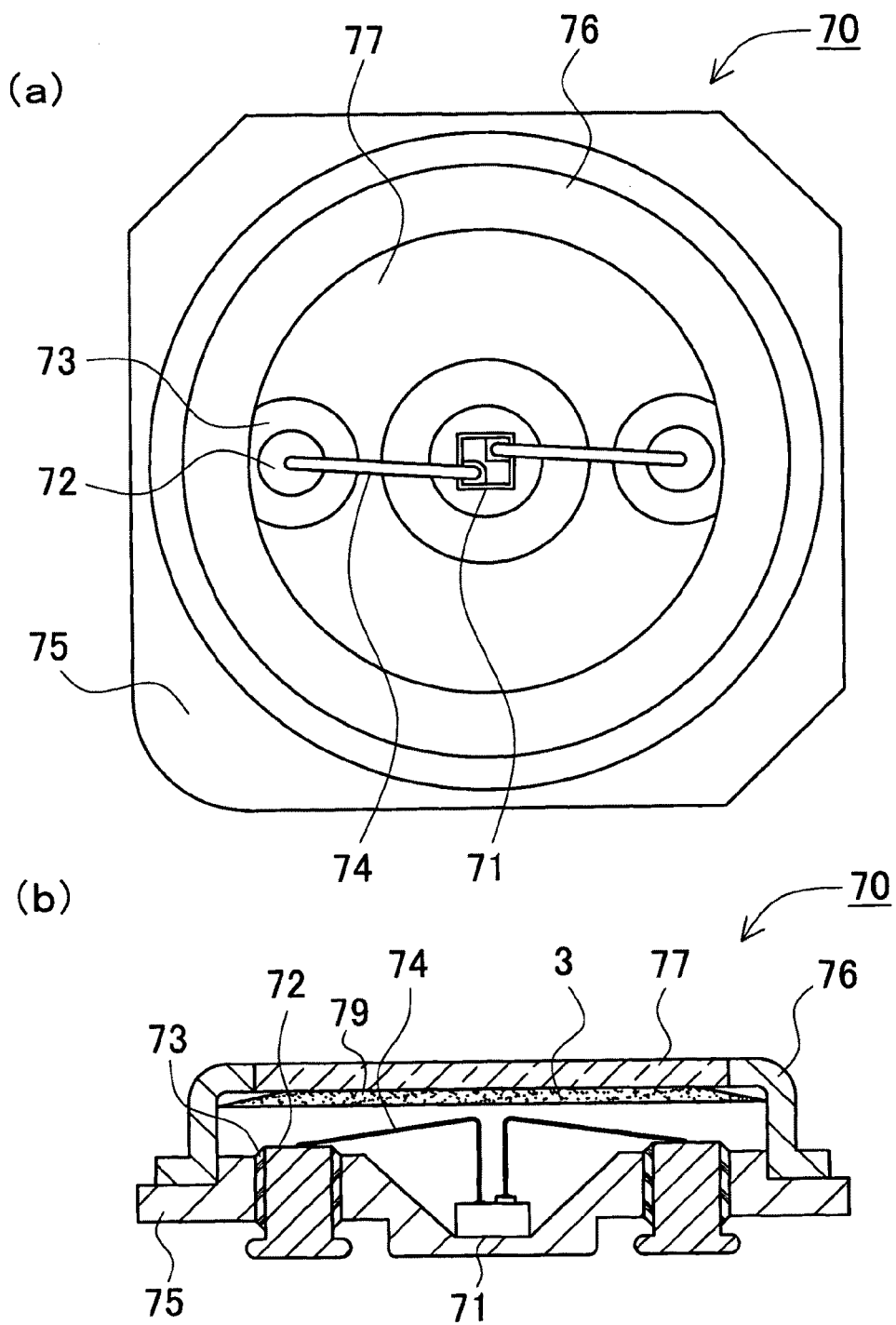
FIG. 29 shows a light emitting device according to Embodiment 3.
Figure 30:
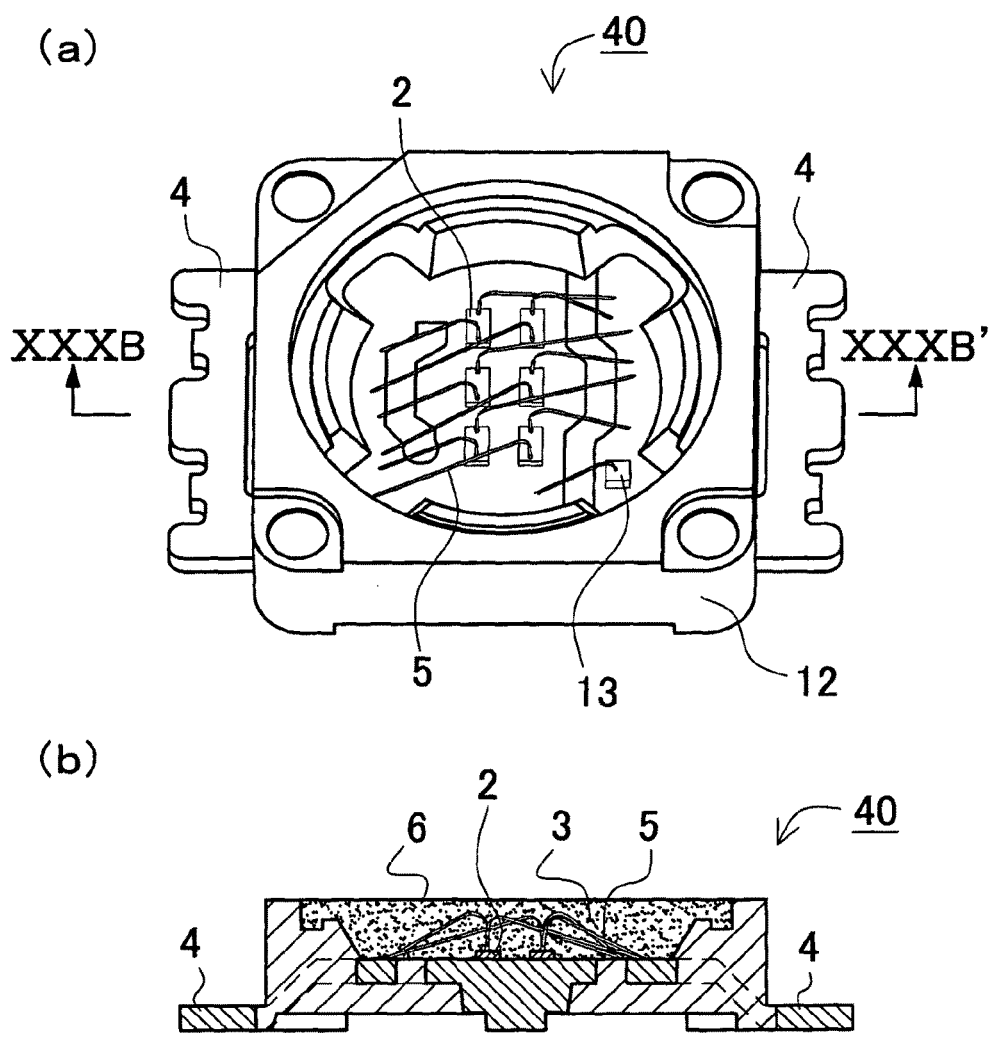
FIG. 30 shows a light emitting device according to Embodiment 4.
Figure 31:
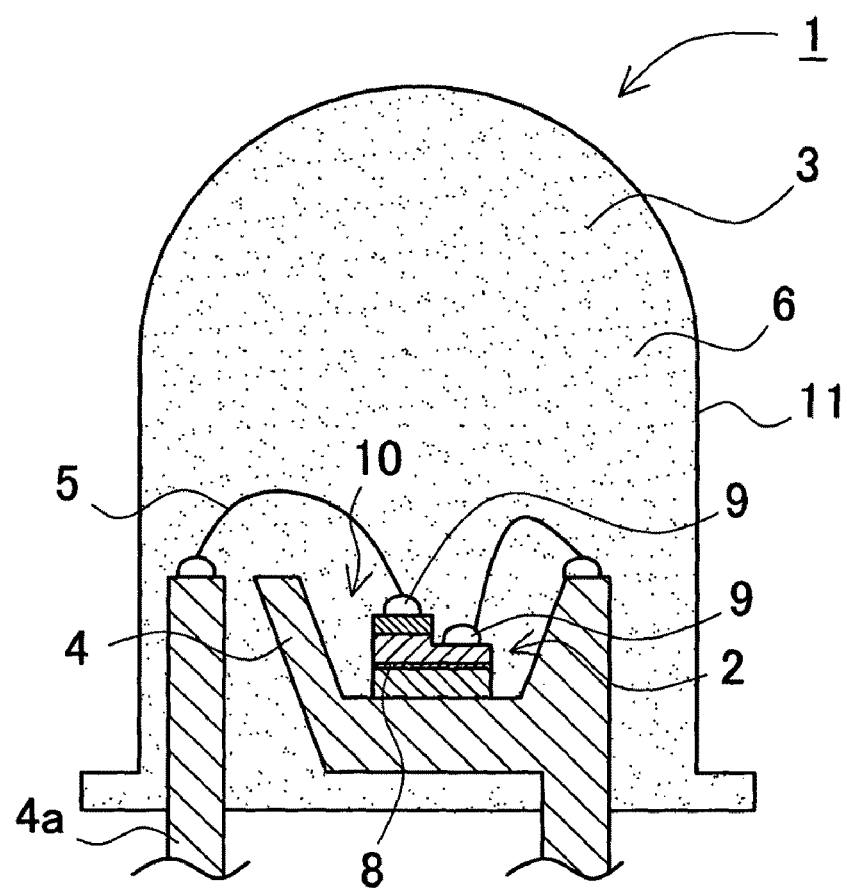
FIG. 31 is a cross-sectional view of a light emitting device according to Embodiment 5.
Figure 32:
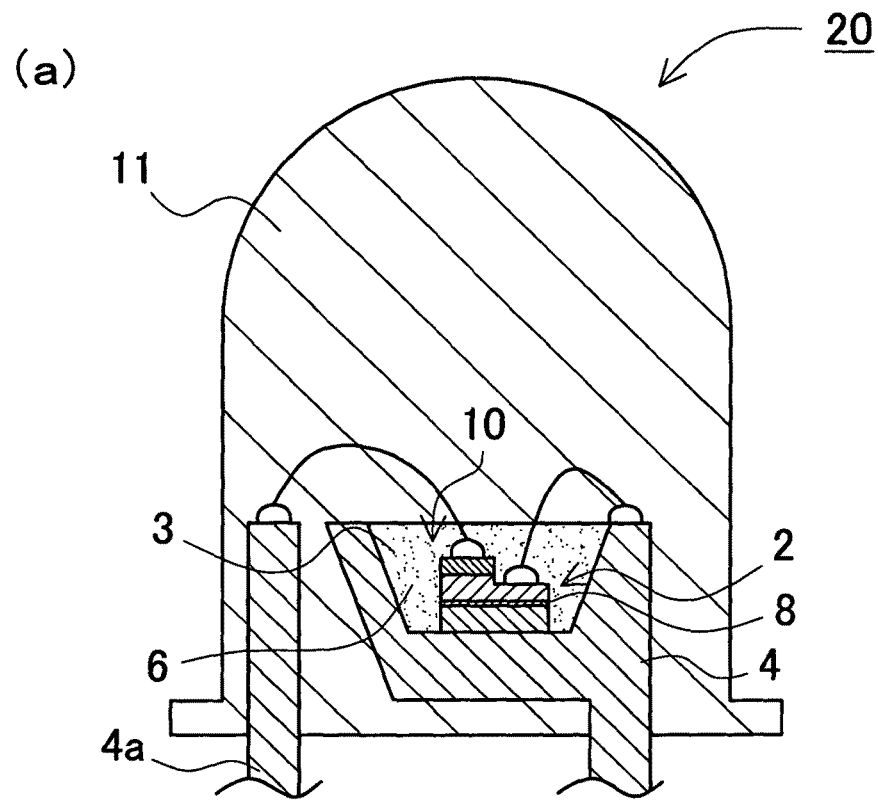
FIG. 32($a$) is a cross-sectional view of a light emitting device according to Embodiment 6 and FIG. 32($b$) is another cross-sectional view of a light emitting device according to Embodiment 6.
Figure 32:
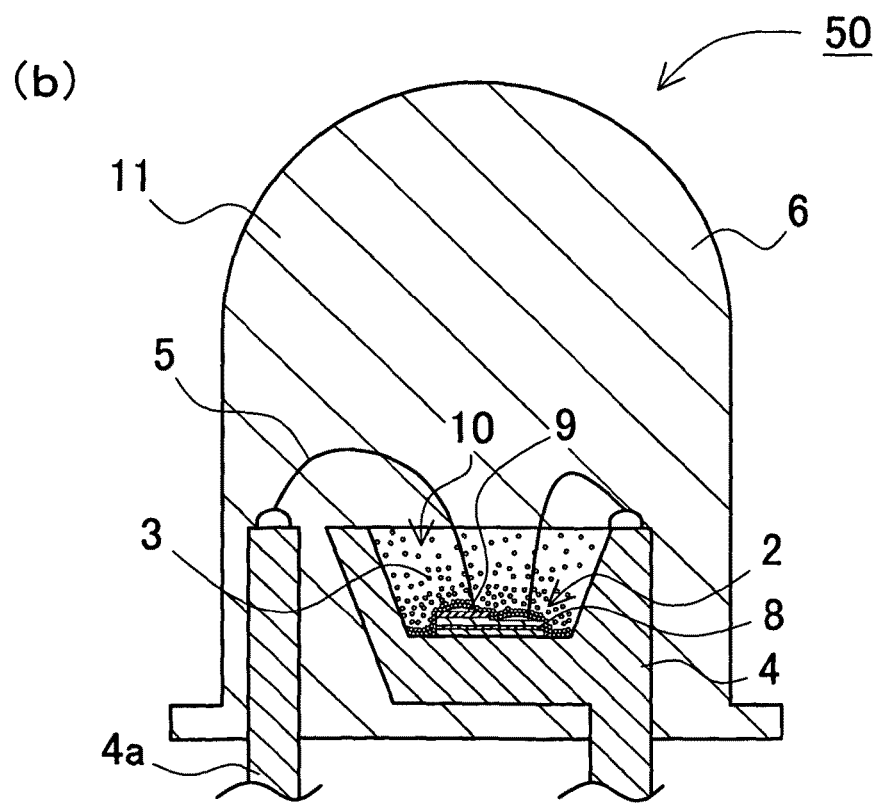
Figure 33:
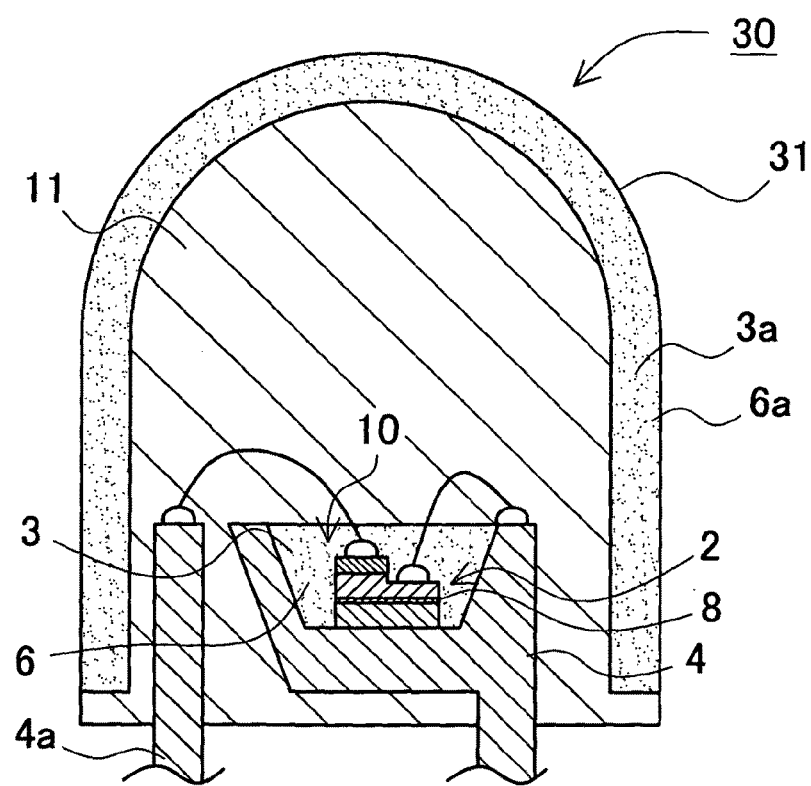
FIG. 33 is a cross-sectional view of a light emitting device according to Embodiment 7.
Figure 34:
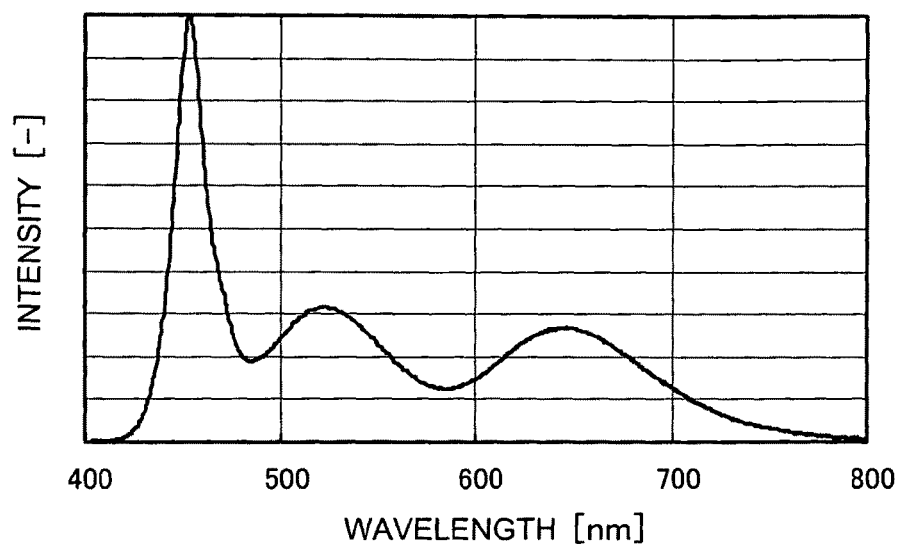
FIG. 34 shows an emission spectrum of a light emitting device according to Example 49.
Figure 35:
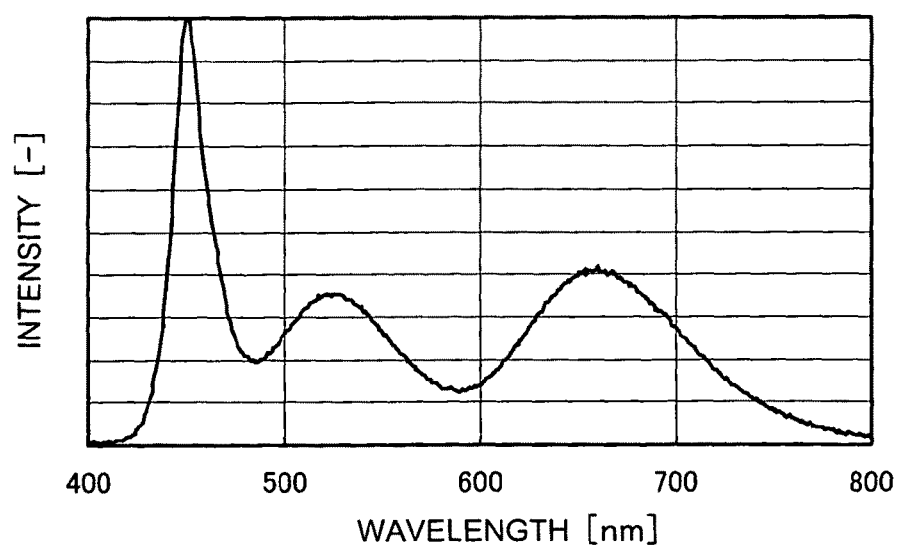
FIG. 35 shows an emission spectrum of a light emitting device according to Example 50.
Figure 36:
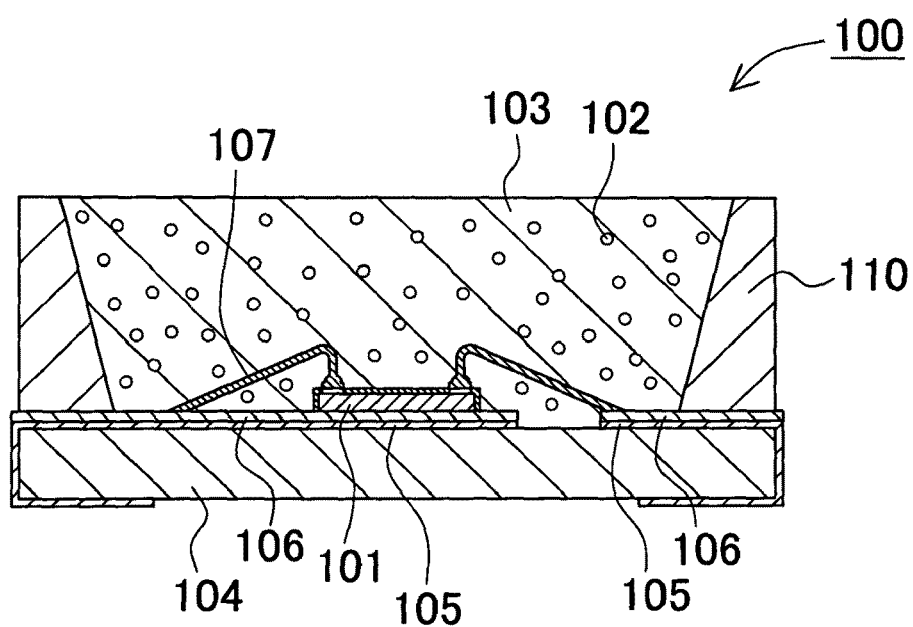
FIG. 36 is a cross-sectional view of a conventional light emitting device.
Figure 37:
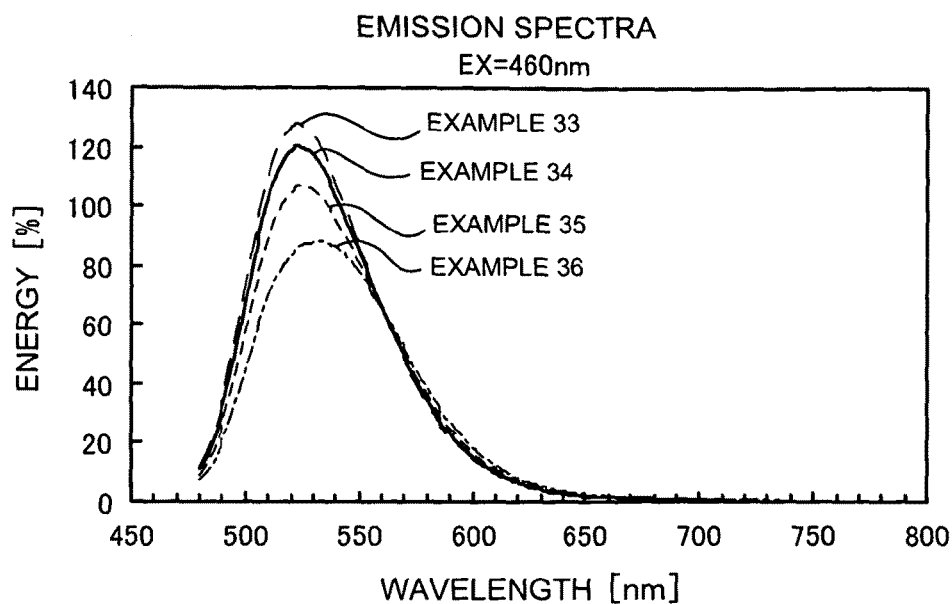
FIG. 37 shows emission spectra of light emitting devices according to Examples 33 to 36.
Figure 38:
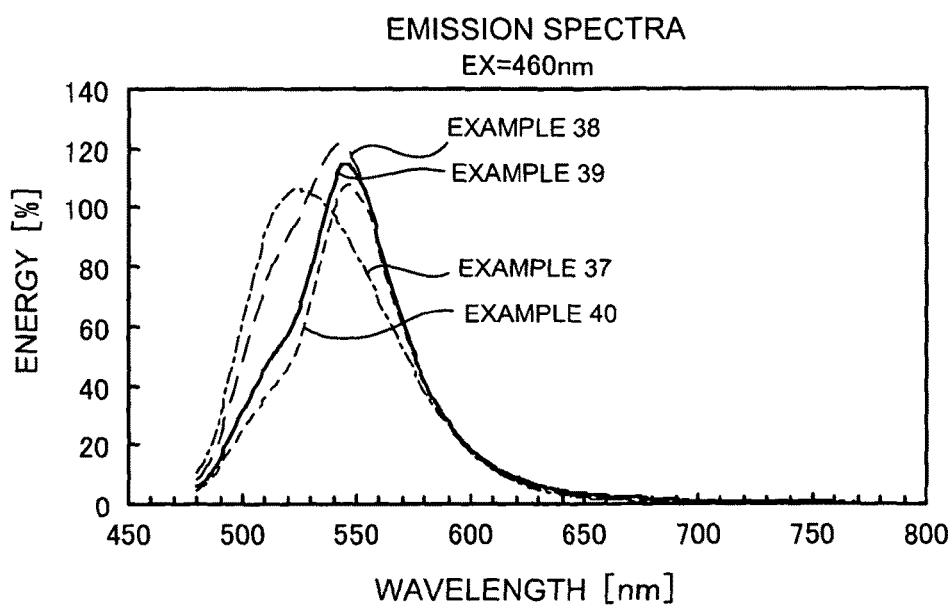
FIG. 38 shows emission spectra of light emitting devices according to Examples 37 to 40.
Figure 39:
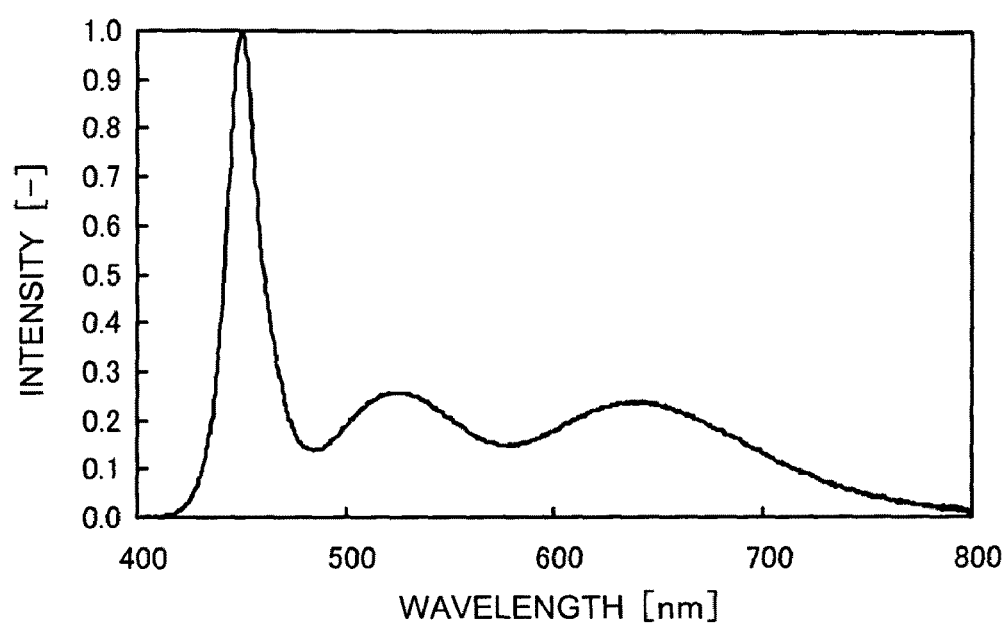
FIG. 39 shows an emission spectrum of a light emitting device according to Example 51.

1, 20, 30, 40, 50, 60, 70: light emitting devices
2: light emitting element
3: phosphor
3$a$: small particle phosphor
4: lead frame
4$a$: lead frame electrode
5: bonding wire
6: resin
6$a$: resin
8: light emitting layer
9: electrode
10: cup
11: mold
12: package
13: protective element
14: recess
15: lead electrode
16: supporting body
17: package
18: encapsulating (encapsulation) member
31: cap
71: light emitting element
72: lead electrode
73: insulating sealing material
74: electrically conductive wire
75: package
76: kovar lid
77: translucent window portion (window portion)
79: coating member
100: light emitting device
101: light emitting element
102: phosphor
103: encapsulating resin encapsulation
104: support body
105: lead electrode
106: reflecting member
107: electrically conductive member
110: cup

The invention claimed is:

1. A phosphor activated with europium and capable of absorbing near-ultraviolet light to blue light and emitting green light,
wherein a substantial composition of the phosphor is represented by a general formula shown below in which x, y, z, a, and b are in the ranges as shown below:

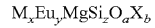

wherein M is at least one selected from the group consisting of Ca, Sr, Ba, Zn, and Mn;
X is at least one selected from the group consisting of F, Cl, Br, and I;
$6.5 \leq x \leq 8.0$; $0.01 \leq y \leq 2.0$; $3.7 \leq z \leq 4.3$;
$a = x + y + 1 + 2z - b/2$; and $1.0 \leq b \leq 1.9$.

2. A phosphor activated with europium and capable of absorbing near-ultraviolet light to blue light and emitting green light,
wherein a substantial composition of the phosphor is represented by a general formula shown below in which x, y, z, w, a, b and c are in the ranges as shown below:

wherein M is at least one selected from the group consisting of Ca, Sr, Ba, Zn, and Mn;
X is at least one selected from the group consisting of F, Cl, Br, and I;
$6.5 \leq x \leq 8.0$; $0.01 \leq y \leq 2.0$; $3.7 \leq z \leq 4.3$; $0 \leq w \leq 0.5$;
$a = x + y + 1 + 2z + (3/2)w - b/2 - (3/2)c$; $1.0 \leq b \leq 1.9$; and $0 \leq c \leq 3.0$.

3. A phosphor activated with europium and capable of absorbing near-ultraviolet light to blue light and emitting green light, wherein a substantial composition of the phosphor is represented by a general formula shown below in which x, y, z, a, and b are in the ranges as shown below:

$$Ca_xEu_y(Mg,Mn)Si_zO_aX_b$$

wherein X is at least one selected from the group consisting of F, Cl, Br, and I;
$6.0 \leq x \leq 10.0$; $0.01 \leq y \leq 2.0$; $3.7 \leq z \leq 5.5$; $a=x+y+1+2z-b/2$; and $0.80 \leq b \leq 1.9$.

4. The phosphor according to claim 1, wherein the phosphor contains chlorine element of 8.0 wt % or less.

5. The phosphor according to claim 1, wherein an amount of at least one element selected from the group consisting of Cl, F, Br and I which is dissolved out from the phosphor is 1500 ppm or less.

6. The phosphor according to claim 1, wherein the phosphor absorbs near-ultraviolet light to blue light to emit green light and has an emission peak wavelength in a wavelength-range from 495 nm to 548 nm.

7. The phosphor according to claim 1, wherein the phosphor has an average particle size of 2 μm to 100 μm.

8. A light emitting device comprising an excitation light source emitting light ranging from near ultraviolet to blue region and a phosphor capable of absorbing a part of light from the excitation light source and emitting green light, wherein the phosphor according to claim 1 is employed.

9. The light emitting device according to claim 8 further comprising a phosphor of $(Ca_{1-x}Sr_x)AlB_ySiN_{3+y}$:Eu or $(Ca_{1-z}Sr_z)_2Si_5N_8$:Eu,
wherein $0 \leq x \leq 1.0$; $0 \leq y \leq 0.5$; and $0 \leq z \leq 1.0$.

10. The light emitting device according to claim 8 further comprising an encapsulating resin of silicone system having a siloxane bond in its molecule.

* * * * *